(12) United States Patent
Chen

(10) Patent No.: US 12,727,202 B2
(45) Date of Patent: Sep. 1, 2026

(54) INTEGRATED CIRCUIT AND FORMATION METHOD THEREOF

(71) Applicant: Taiwan Semiconductor Manufacturing Company, Ltd., Hsinchu (TW)

(72) Inventor: Chih-Yang Chen, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 657 days.

(21) Appl. No.: 18/163,261

(22) Filed: Feb. 1, 2023

(65) Prior Publication Data

US 2024/0258435 A1 Aug. 1, 2024

(51) Int. Cl.

| | |
|---|---|
| ***H10D 30/67*** | (2025.01) |
| ***H10D 62/10*** | (2025.01) |
| ***H10D 62/13*** | (2025.01) |
| ***H10D 84/01*** | (2026.01) |
| ***H10D 84/83*** | (2025.01) |

(52) U.S. Cl.

CPC ..... *H10D 30/6757* (2025.01); *H10D 30/6735* (2025.01); *H10D 62/121* (2025.01); *H10D 62/151* (2025.01); *H10D 84/834* (2025.01); *H10D 62/115* (2025.01); *H10D 62/116* (2025.01); *H10D 84/0151* (2025.01)

(58) Field of Classification Search

None

See application file for complete search history.

(56) References Cited

U.S. PATENT DOCUMENTS

| | | | | |
|---|---|---|---|---|
| 9,209,247 | B2 | 12/2015 | Colinge et al. | |
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2019/0006345 | A1 * | 1/2019 | Wang | H10D 84/0151 |
| 2021/0035971 | A1 * | 2/2021 | Park | H10D 84/0151 |
| 2021/0233906 | A1 * | 7/2021 | Chen | H10D 84/0151 |
| 2022/0130957 | A1 * | 4/2022 | Kim | H10D 30/014 |
| 2022/0406775 | A1 * | 12/2022 | Kim | H10D 64/017 |

* cited by examiner

*Primary Examiner* — Julio J Maldonado
*Assistant Examiner* — Pinaki Das
(74) *Attorney, Agent, or Firm* — JCIPRNET

(57) ABSTRACT

An integrated circuit and a formation method thereof are provided. The integrated circuit includes first and second gate structures; first and second channel structures, laterally penetrating through the first and second gate structures, respectively; first and second source/drain structures, disposed between the first and second gate structures, and in lateral contact with the first and second channel structures, respectively; an isolation wall, extending in between the first and second source/drain structures, and cutting each of the first and second gate structures into separate portions; and a lateral contact structure, extending in between the first and second gate structures, and connecting the first source/drain structure to the second source/drain structure without being cut by the isolation wall.

20 Claims, 28 Drawing Sheets

112
120
X'
TR
304
(116)
304
(116)
$R_{120}$
300
102
108
110
X
D1

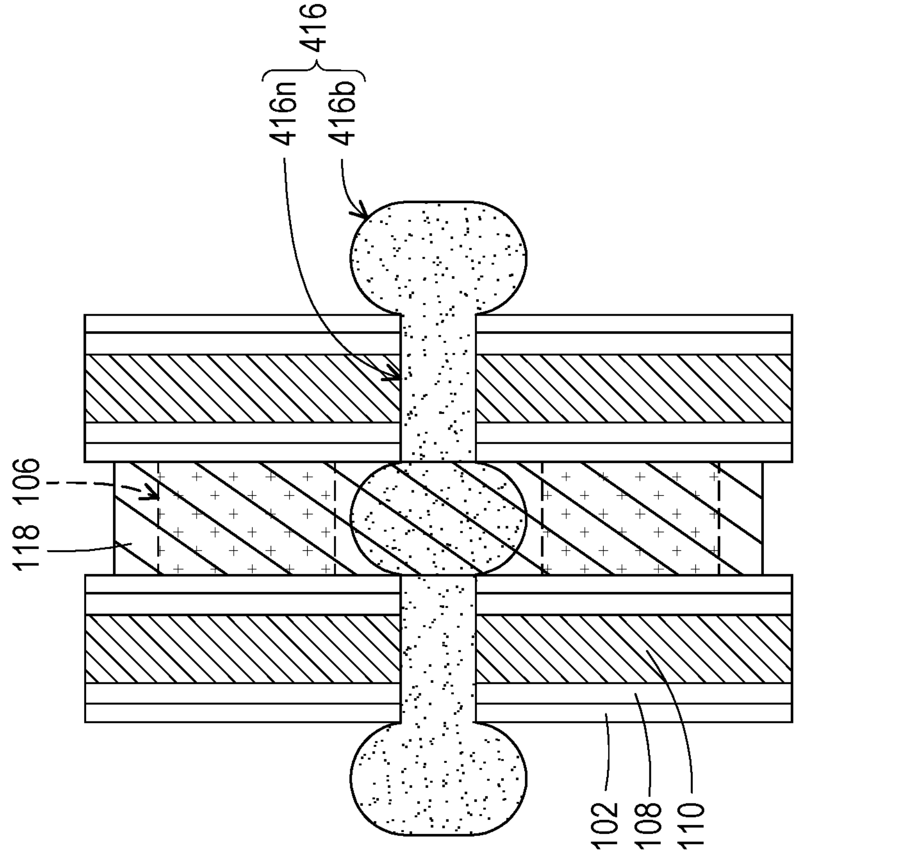
FIG. 4A
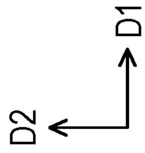

INTEGRATED CIRCUIT AND FORMATION METHOD THEREOF

BACKGROUND

An integrated circuit may include field effect transistors (FETs) interconnected to perform various logic functions. The FETs include channel structures, gate structures intersected with the channel structures, and source/drain structures at opposite sides of each gate structure and in contact with the channel structures. Generally, the gate structures may be arranged to be parallel with one another, and may be initially formed with the same length. Eventually, some of the gate structures may be cut into separate line sections by isolation structures, which are also referred to as cut metal gates (CMGs). By layout design, some of the CMGs may intersect with lateral contact structures for connecting source/drain structures of adjacent FETs, and cut these source/drain contacts into broken sections. As a consequence, the source/drain contacts are no longer functional, and additional routings may be required for restoring the electrical connections.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a schematic plan view illustrating an isolation wall, along with gate structures cut by the isolation wall and a lateral contact structure extending between the segmented gate structures, according to some embodiments of the present disclosure.

DETAILED DESCRIPTION

Figure 1A:
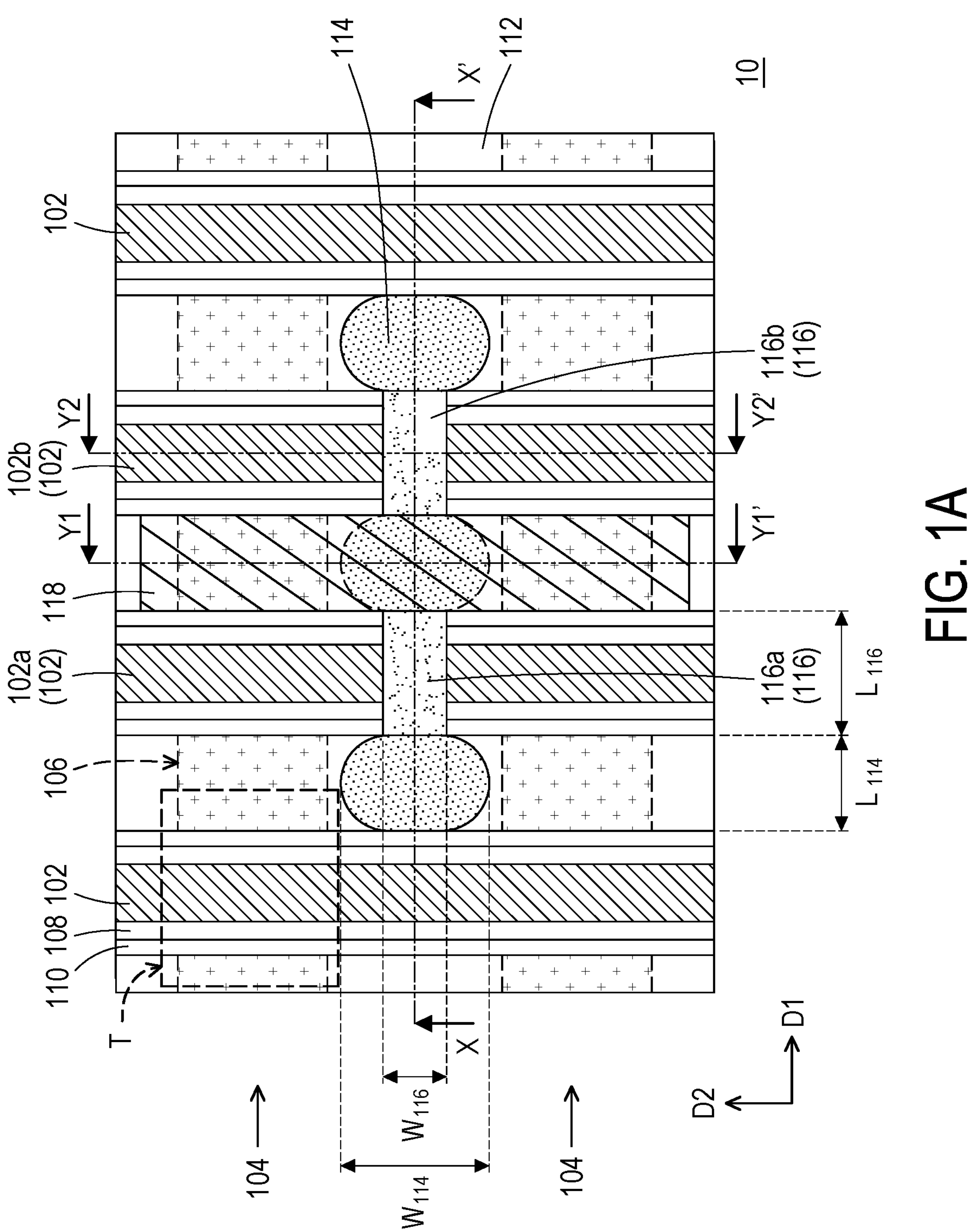
FIG. 1A is a schematic plan view illustrating a portion of an integrated circuit, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, source/drain structures(s) may refer to a source structure or a drain structure, individually or collectively dependent upon the context.

FIG. 1A is a schematic plan view illustrating a portion of an integrated circuit 10, according to some embodiments of the present disclosure.

Referring to FIG. 1A, the integrated circuit 10 includes an array of field effect transistors (FETs) T respectively defined at an intersection of one of a plurality of gate structures 102 and one of a plurality of channel structures 104. The channel structures 104 may laterally penetrate through the gate structures 102, and source/drain structures 106 of the FETs T may be disposed in breaks of the channel structures 104 at opposite sides of each gate structure 102, such that the channel structures 104 are in lateral contact with the source/drain structures 106. Since the channel structures 104 are embedded in the gate structures 102 and break at positions of the source/drain structures 106, the channel structures 104 may not be revealed in a plan view. Therefore, the channel structures 104 are only indicated by arrows in FIG. 1A, which show an extending direction of the channel structures 104. According to some embodiments, the gate structures 102 extend along a first lateral direction D1, while the channel structures 104 extend along a second lateral direction D2 intersected with the first lateral direction D1.

For each FET T, the gate structure 102 extending therethrough is functioned as a gate terminal, and a pair of the source/drain structures 106 at opposite sides of the gate structure 102 and in lateral contact with the channel structure 104 crossing the gate structure 102 are functioned as source and drain terminals. In some embodiments, the FETs T arranged along one of the channel structures 104 are N-type FETs (NFETs), whereas the FETs T arranged along another one of the channel structures 104 are P-type FETs (PFETs). The NFETs and PFETs can be interconnected to form various logic components.

In order to separate the gate structures 102 from the source/drain structures 106, opposite sidewalls of each gate structure 102 are lined with a sidewall spacer 108. Further, the sidewall spacers 108 may be additionally covered by an etching stop layer 110, such that the sidewall spacers 108 may extend in between the gate structures 102 and the etching stop layers 110. Although not shown, the etching stop layer 110 may further cover the source/drain structures 106 as well as a trench isolation structure (the trench isolation structure 120 to be described with reference to FIG. 1B through FIG. 1D) surrounding the channel structures 104.

In order to provide a planar surface for an interconnection structure (not shown) formed over the FETs T, an interlayer dielectric 112 may be used to fill out empty space around the gate structures 104, and may be formed to a height substantially leveled with top surfaces of the gate structures 104. As will be further described, the interlayer dielectric 112 may be partially removed to form openings, and these openings are refilled by dielectric structures 114. The openings of the interlayer dielectric 112 and the refilled dielectric structures 114 may be separately arranged along a direction (e.g., the first lateral direction D1) intersected with the extending direction of the gate structures 102 (e.g., the second lateral direction D2). Further, each opening of the interlayer dielectric 112 and the corresponding refilled dielectric structure 114 are laterally surrounded by adjacent ones of the gate structures 102 and adjacent ones of the source/drain structures 106 between these adjacent gate structures 102. Although the openings of the interlayer dielectric 112 and the refilled dielectric structures 114 are depicted as rounded rectangular patterns, the openings of the interlayer dielectric 112 and the refilled dielectric structures 114 can be formed in any other possible shapes, the present disclosure is not limited thereto.

An isolation wall 116 is disposed between adjacent ones of the channel structures 104, and may be substantially parallel with these channel structures 104. Further, the isolation wall 116 laterally extends through adjacent ones of the gate structures 102, to cut each of these gate structures 102 into separate line sections. In addition, the sidewall spacers 108 and portions of the etching stop layer 110 lining along opposite sidewalls of these gate structures 102 may also be cut into separate sections by the isolation wall 116. Instead of continuously extending across these gate structures 102, the isolation wall 116 includes separate line sections respectively extending through one of these gate structures 102 (and also the sidewall spacers 108 as well as portions of the etching stop layer 110 lining along). As an example, the isolation wall 116 includes a line section 116*a* and a line section 116*b* laterally spaced apart from the line section 116*a*. Both of the line sections 116*a*, 116*b* extend along and located in between adjacent ones of the channel structures 114. Individually, the line section 116*a* extends across a first one of the gate structures 102 (also referred to as a gate structure 102*a*) and the sidewall spacer 108 as well as a portion of the etching stop layer 110 lining along, and the line section 116*b* extends across a second one of the gate structures 102 (also referred to as a gate structure 102*b*) and the sidewall spacer 108 as well as a portion of the etching stop layer 110 lining along.

Further, the line sections of the isolation wall 116 each extend between two of the refilled dielectric structures 114, and the refilled dielectric structures 114 are connected with one another through the line sections of the isolation wall 116. The gate structures 102 being cut by the isolation wall 116 respectively extend between two of the refilled dielectric structures 114. Portions of the etching stop layer 110 lining along these gate structures 102 may be in direct lateral contact with the refilled dielectric structures 114, or in lateral contact with the refilled dielectric structures 114 through portions of the interlayer dielectric 112 extending in between. As an example, the gate structure 102*a* and the line section 116*a* of the isolation wall 116 cutting through the gate structure 102*a* are located between first and second ones of the refilled dielectric structures 114, and the gate structure 102*b* and the line section 116*b* of the isolation wall 116 cutting through the gate structure 102*b* are located between the second one and a third one of the refilled dielectric structures 114. Further, portions of the etching stop layer 110 lining along the gate structures 102*a*, 102*b* may be in direct lateral contact with the refilled dielectric structures 114.

In regarding dimensions, a width $W_{116}$ of the line sections of the isolation wall 116 (measured along the second lateral direction D2) is less than a width $W_{114}$ of the refilled dielectric structures 114 (also measured along the second lateral direction D2). That is, the refilled dielectric structures 114 are connected with one another through narrow bridges provided by the line sections of the isolation wall 116. In addition, a length $L_{116}$ of the line sections of the isolation wall 116 (measured along the first lateral direction D1) may be substantially equal to a summation of a width of each gate structure 102 and a total thickness of the sidewall spacer 108 as well as a portion of the etching stop layer 110 lining along, whereas a length $L_{114}$ of each refilled dielectric structure 114 may be substantially equal to or slightly less than a spacing measured between portions of the etching stop layer 110 lining along opposing sidewalls of adjacent gate structures 102.

Two or more of the source/drain structures 106 separately arranged between the gate structures 102 cut by the isolation wall 116 are electrically connected through a lateral contact structure 118 formed thereon. The lateral contact structure 118 continuously extends through a spacing between adjacent line sections of the isolation wall 116, rather than being cut into separate portions by the isolation wall 116. Therefore, these source/drain structures 106 can be connected through the lateral contact structure 118, without assistance of additional routings running above the lateral contact structure 118. In other words, these source/drain structures 106 can be connected via a shortest distance, and valuable overhead routing area can be less crowded. As an example, the lateral contact structure 118 is located between the gate structures 102*a*, 102*b*, and continuously extends through a spacing between the line sections 116*a*, 116*b* of the isolation wall 116, to establish electrical connection between two adjacent source/drain structures 106 located between the gate structures 102*a*, 102*b*.

Further, the lateral contact structure 118 may overlap one of the refilled dielectric structures 114 located between the line sections of the isolation wall 116 at opposite sides of the lateral contact structure 118. As will be further described, this refilled dielectric structure 114 may be recessed during formation of the lateral contact structure 118, thus may have a top end lower than top surfaces of other refilled dielectric structures 114 that are substantially leveled with the top surfaces of the gate structures 102. For instance, the refilled dielectric structure 114 between the gate structures 102*a*, 102*b* is covered the lateral contact structure 118, and is recessed with respect to other refilled dielectric structures 114.

In some embodiments, the lateral contact structure 118 is in lateral contact with portions of the etching stop layer 110 lining along opposing sidewalls of the gate structures 102 at opposite sides of the lateral contact structure 118 (e.g., the gate structures 102*a*, 102*b*), and in lateral contact with the line sections of the isolation wall 116 at opposite sides of the lateral contact structure 118 (e.g., the line sections 116*a*, 116*b* of the isolation wall 116). In these embodiments, a width of the lateral contact structure 118 may be substantially equal to or slightly less than a spacing between these portions of the etching stop layer 110 lining along opposing sidewalls of the gate structures 102, and a spacing between these line sections of the isolation wall 116.

In some embodiments, the source/drain structures 106 are epitaxial structures formed of a semiconductor material, while the lateral contact structure 118 used for connecting some of the source/drain structures 106 is formed of a conductive material, such as metal, metal alloy or polysilicon.

Figure 1B:
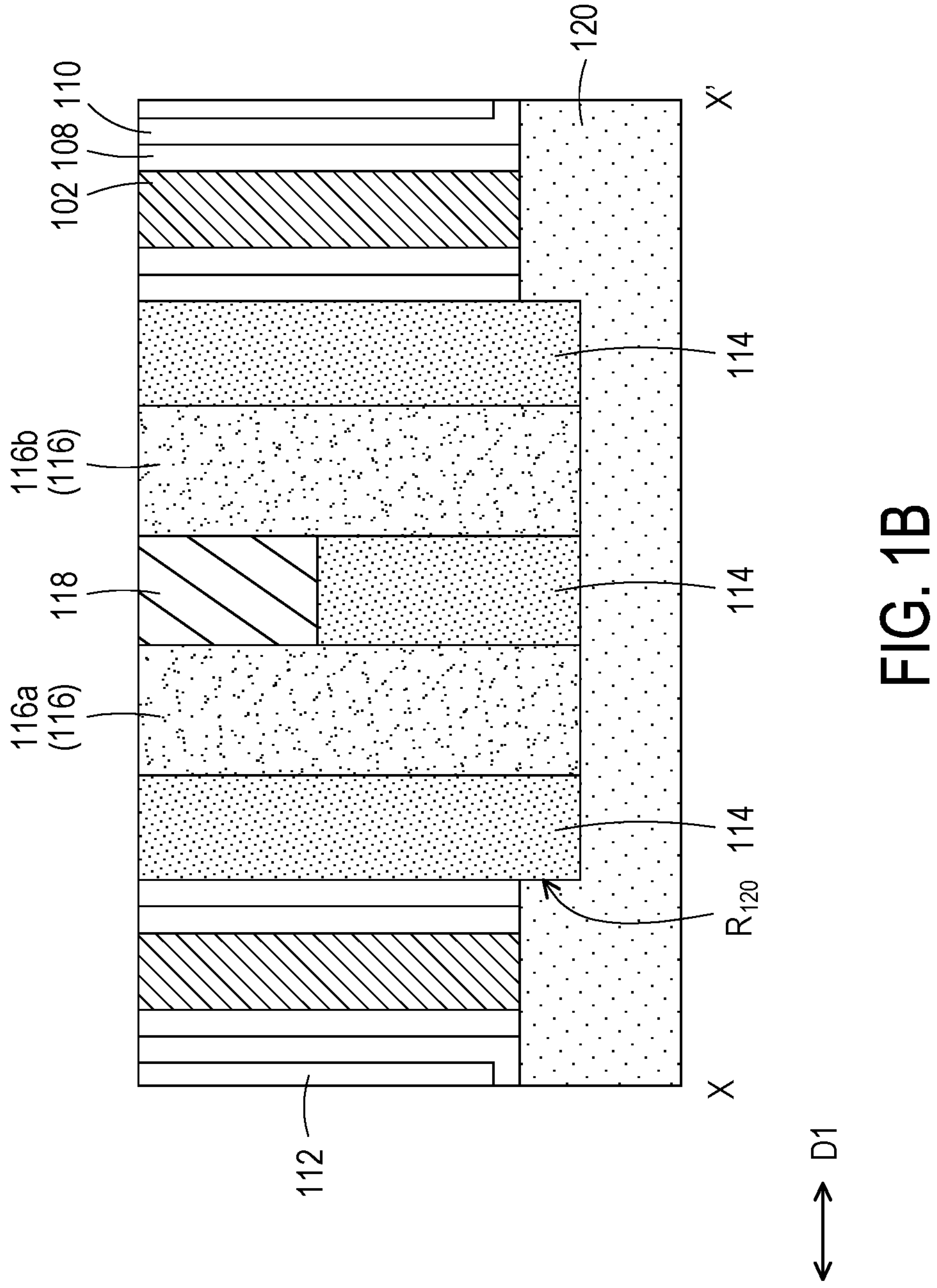
FIG. 1B is a schematic cross-sectional view along an X-X' line shown in FIG. 1A.

FIG. 1B is a schematic cross-sectional view along an X-X' line shown in FIG. 1A; FIG. 1C is a schematic cross-sectional view along an Y1-Y1' line shown in FIG. 1A; and FIG. 1D is a schematic cross-sectional view along an Y2-Y2' line shown in FIG. 1A.

Figure 1D:
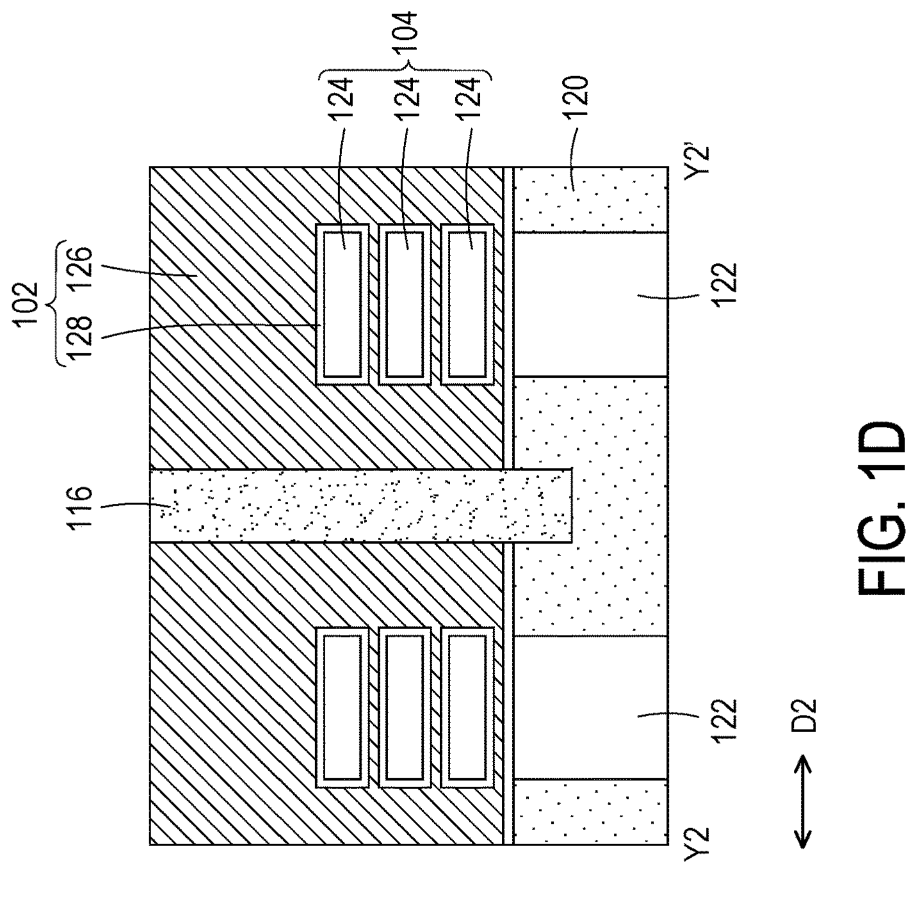
FIG. 1D is a schematic cross-sectional view along an Y2-Y2' line shown in FIG. 1A.
Figure 1C:
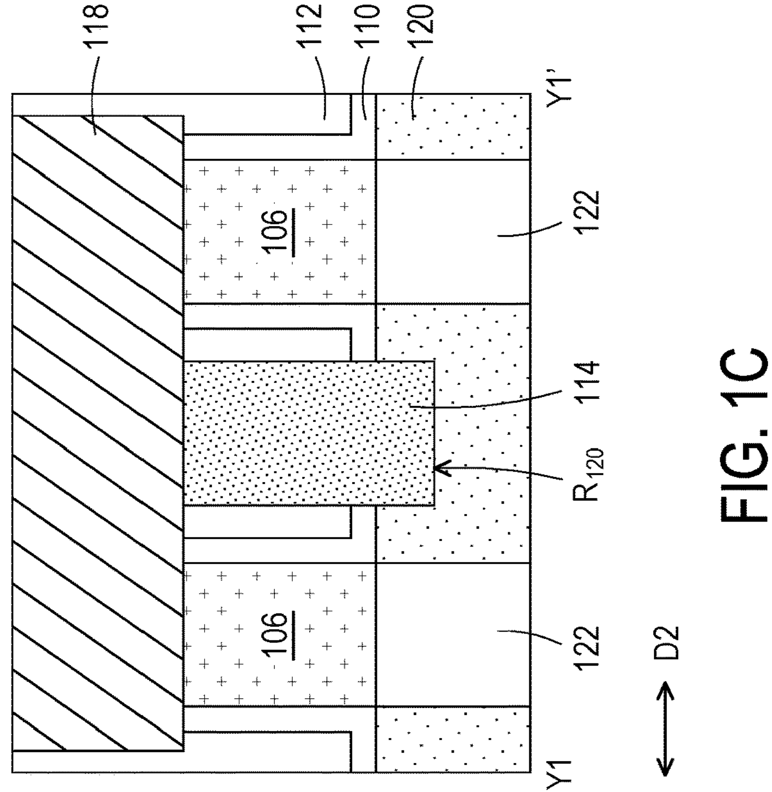
FIG. 1C is a schematic cross-sectional view along an Y1-Y1' line shown in FIG. 1A.

As shown in FIG. 1B, FIG. 1C and FIG. 1D, a trench isolation structure 120 laterally surrounds portions of a semiconductor substrate 122 on which the channel structures 104 and the source/drain structures 106 are formed. As indicated by FIG. 1A and FIG. 1B, the gate structures 102 and the lateral contact structure 118 cross the trench isolation structure 120 from above, whereas the line sections of the isolation wall 116 formed on the trench isolation structure 120 separately extend along the trench isolation structure 120. As shown in FIG. 1B, the line sections of the isolation wall 116 are each located between two of the refilled dielectric structures 114. One of the refilled dielectric structures 114 between the line sections of the isolation wall 116 is formed to a height shorter than others of the refilled dielectric structures 114. The lateral contact structure 118 extending through a spacing between the line sections of the isolation wall 116 overlaps the relatively short one of the refilled dielectric structures 114. In some embodiments, a top surface of the lateral contact structure 118 is substantially coplanar with top surfaces of the gate structures 102, topmost ends of the sidewall spacer 108 and the etching stop layer 110, top surfaces of the line sections of the isolation wall 116 and top surfaces of the relatively tall ones of the refilled dielectric structures 114. Further, in some embodiments, the isolation wall 116 and the refilled dielectric structures 114 protrude into the trench isolation structure 120, with respect to the gate structures 102. Correspondingly, the trench isolation structure 120 has a recess $R_{120}$ accommodating bottom portions of the isolation wall 116 and the refilled dielectric structures 114.

Referring to FIG. 1A and FIG. 1C, the lateral contact structure 118 is in contact with the overlapped source/drain structures 106 and refilled dielectric structure 114 from above, and is laterally surrounded by the interlayer dielectric 112. As shown in FIG. 1C, the top surface of the lateral contact structure 118 may be substantially coplanar with a top surface of the interlayer dielectric 112. In addition, the etching stop layer 110 may separate the interlayer dielectric 112 from the source/drain structures 106 and the trench isolation structure 120. On the other hand, as similar to other refilled dielectric structures 114, the refilled dielectric structure 114 overlapped with the lateral contact structure 118 penetrates through the etching stop layer 110, and extends into the recess $R_{120}$ of the trench isolation structure 120.

Referring to FIG. 1A and FIG. 1D, the channel structures 104 may respectively include stacks of semiconductor sheets 124. Each stack is formed on one of the portions of the semiconductor substrate 122 laterally surrounded by the trench isolation structure 120, and is intersected with one of the gate structures 102. The semiconductor sheets 124 in each stack are vertically separated from one another, and are respectively wrapped around by the intersecting gate structure 102.

The gate structures 102 respectively include a gate electrode 126 wrapping around the intersected semiconductor sheets 124, and include dielectric layers 128 separating the gate electrode 126 from the intersected semiconductor sheets 124, the underlying semiconductor substrate 122 and the trench isolation structure 120. Although not shown, one or more work function layer(s) may extend between each dielectric layer 128 and the gate electrode 126 wrapping around. Further, an interfacial layer (also not shown) may lie between each semiconductor sheet 124 and the covered dielectric layer 128. The gate structure 102 shown in FIG. 1D (i.e., the gate structure 102*b*) is cut into separate portions by the isolation wall 116. As a result, the gate electrode 126 of this gate structure 102 (i.e., the gate structure 102*b*) has separate portions with a spacing filled by the isolation wall 116. Also, the dielectric layer 128 underlying this gate structure 126 is penetrated through by the isolation wall 116.

As described above, the isolation wall 116 for cutting adjacent gate structures 102 has separate line sections (e.g., the line sections 116*a*, 116*b*), and the lateral contact structure 118 for connecting adjacent source/drain structures 106 between these gate structures 102 continuously extends through the spacing between the line sections of the isolation wall 116. Therefore, cutting of these gate structures 102 can be realized without breaking the lateral contact structure 118 in between these gate structures 102. Therefore, electrical connection of the source/drain structures 106 between these gate structures 102 can be established through the lateral contact structure 118, without requirement of additional routings disposed on the lateral contact structure 118. Accordingly, such electrical connection can be improved, and valuable overhead routing area can be less crowded.

Figure 2:
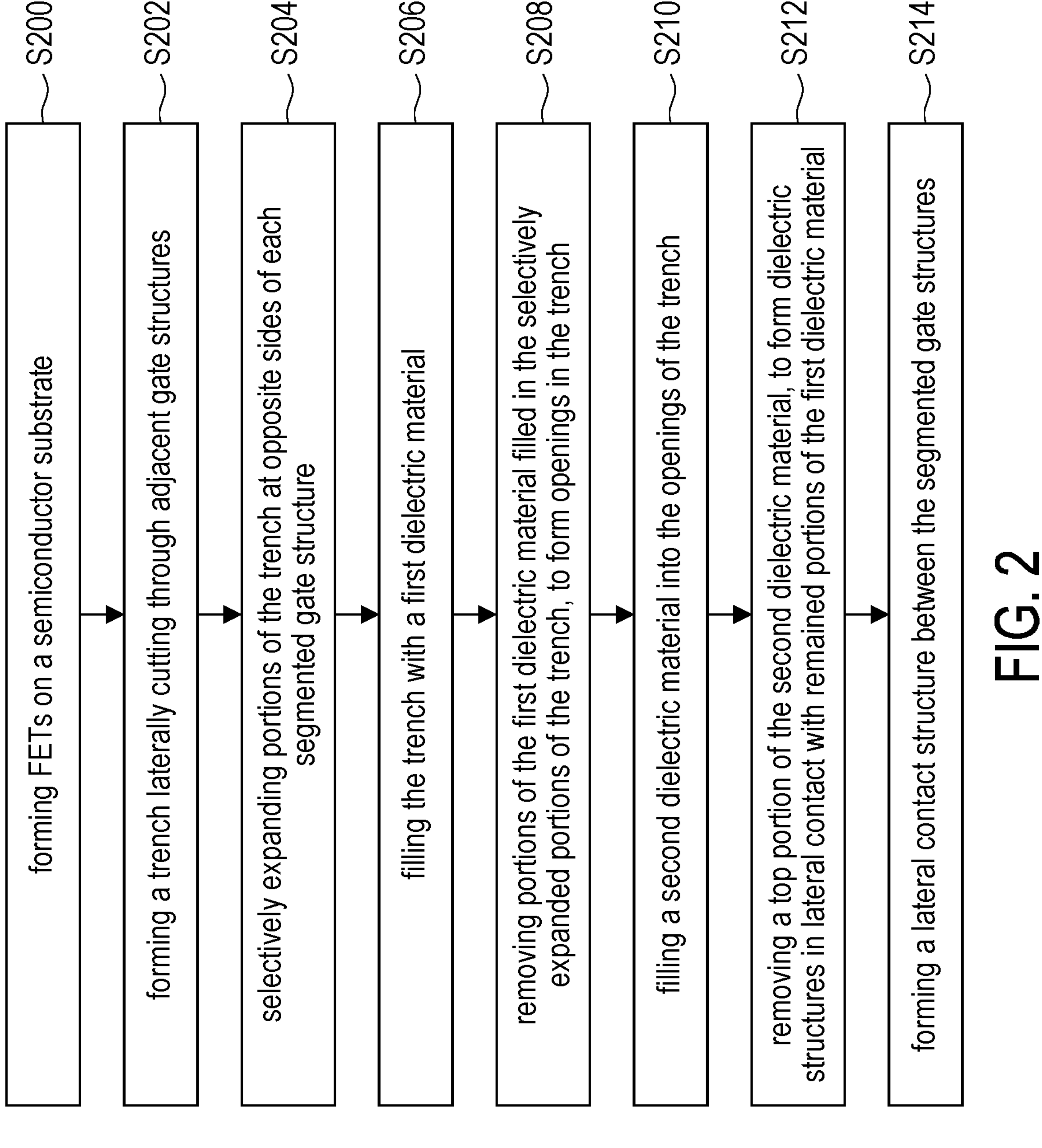
FIG. 2 is a flow diagram illustrating a process including forming the isolation wall and the lateral contact structure shown in FIG. 1A through FIG. 1D, according to some embodiments of the present disclosure.
Figure 3A:
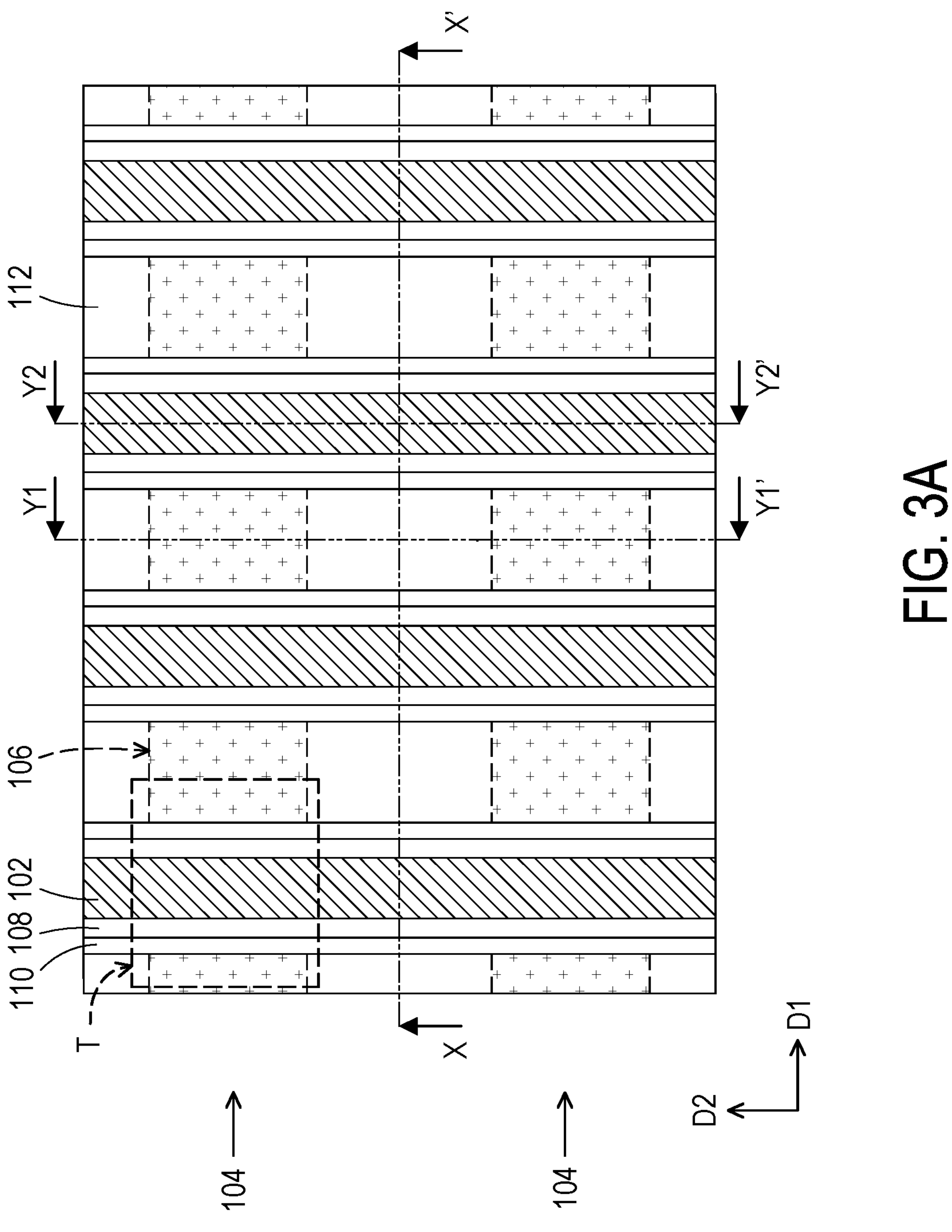
FIG. 3A through FIG. 3X are schematic plan views and schematic cross-sectional views illustrating intermediate structures during the process as shown in FIG. 2.
Figure 3B:
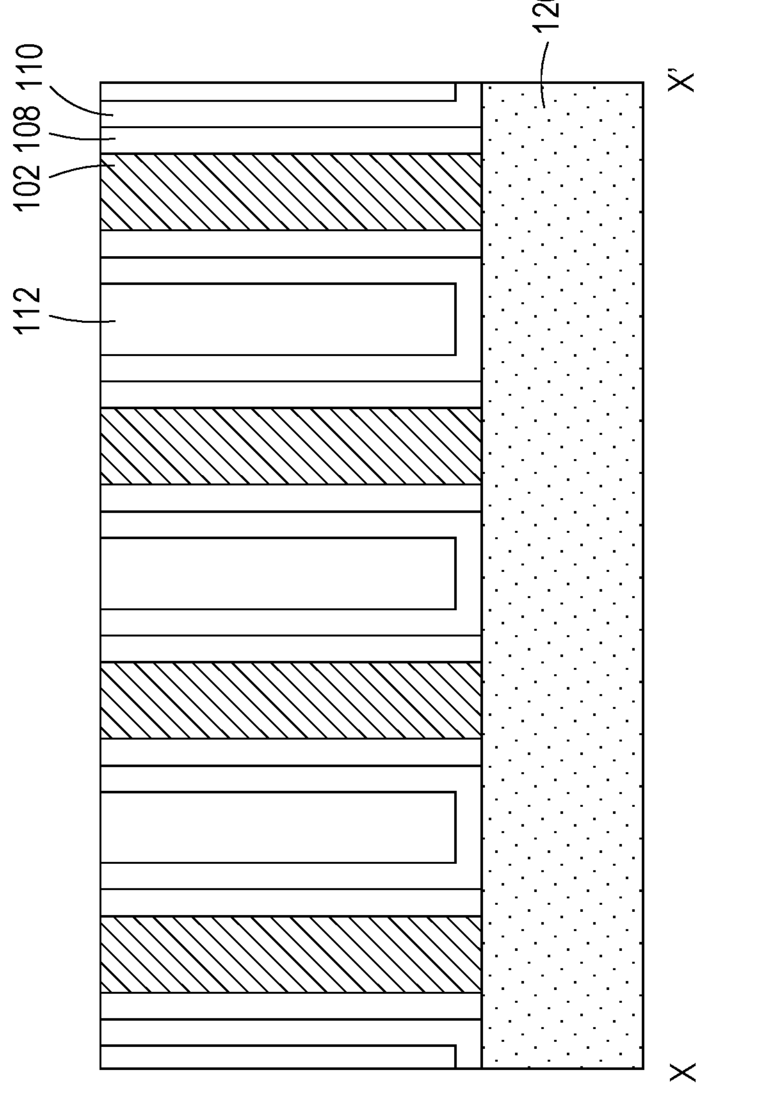
Figure 3D:
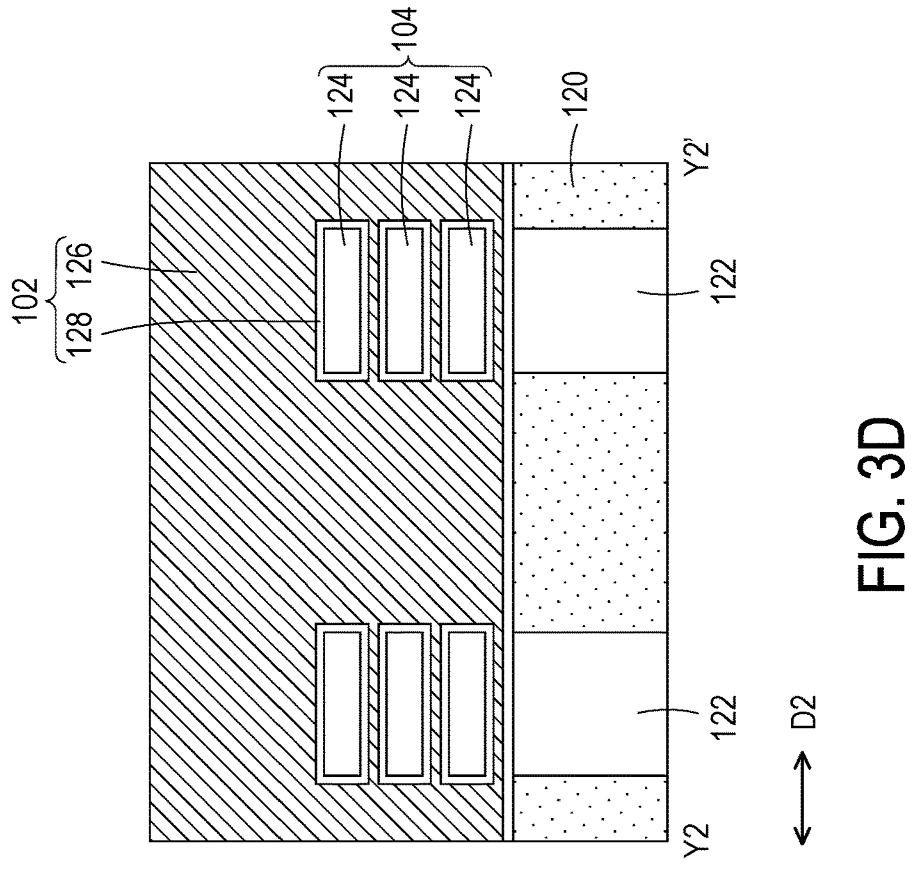

FIG. 2 is a flow diagram illustrating a process for forming the isolation wall 116 and the lateral contact structure 118, according to some embodiments of the present disclosure. FIG. 3A through FIG. 3X are schematic plan views and schematic cross-sectional views illustrating intermediate structures during the process as shown in FIG. 2. Among the FIG. 3A through FIG. 3X, FIG. 3A, FIG. 3E, FIG. 3I, FIG. 3M, FIG. 3Q and FIG. 3U are schematic plan views. In addition, FIG. 3B, FIG. 3F, FIG. 3J, FIG. 3N, FIG. 3R and FIG. 3V are schematic cross-sectional views along a X-X' line shown in FIG. 3A, FIG. 3E, FIG. 3I, FIG. 3M, FIG. 3Q and FIG. 3U, respectively; FIG. 3C, FIG. 3G, FIG. 3K, FIG. 3O, FIG. 3S and FIG. 3W are schematic cross-sectional views along a Y1-Y1' line shown in FIG. 3A, FIG. 3E, FIG. 3I, FIG. 3M, FIG. 3Q and FIG. 3U, respectively; and FIG. 3D, FIG. 3H, FIG. 3L, FIG. 3P, FIG. 3T and FIG. 3X are schematic cross-sectional views along a Y2-Y2' line shown in FIG. 3A, FIG. 3E, FIG. 3I, FIG. 3M, FIG. 3Q and FIG. 3U, respectively.

Figure 3C:
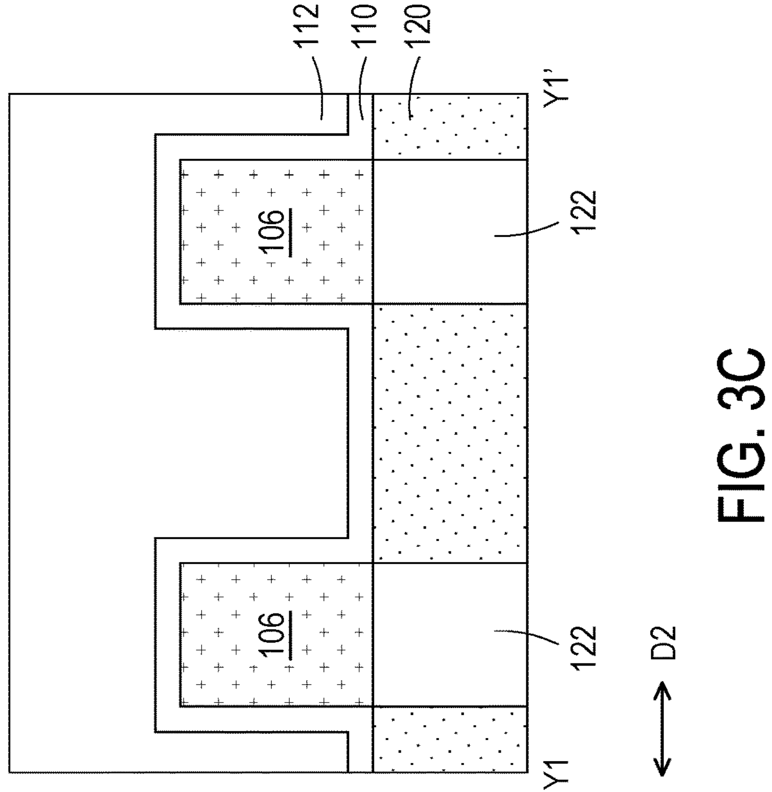

Referring to FIG. 2 and FIG. 3A through FIG. 3D, at a step S200, the FETs T are formed on the semiconductor substrate 122. Although not described in details, a series of operations may be involved for forming the channel structures 104, the gate structures 102, the sidewall spacers 108 and the source/drain structures 106 of the FETs T. Before formation of the channel structures 104, the trench isolation structure 120 may be formed into the semiconductor substrate 122. Further, the etching stop layer 110 may be formed along with the gate structures 102. As shown in FIG. 3C, currently the trench isolation structure 120 and the source/drain structures 106 between the gate structures 102 may be entirely covered by the etching stop layer 110. Moreover, after formation of the FETs T, the interlayer dielectric layer 112 may be provided in between the gate structures 102, to fill out empty space between the gate structures 102. As a result, the etching stop layer 110 is covered by the interlayer dielectric 112.

Figure 3E:
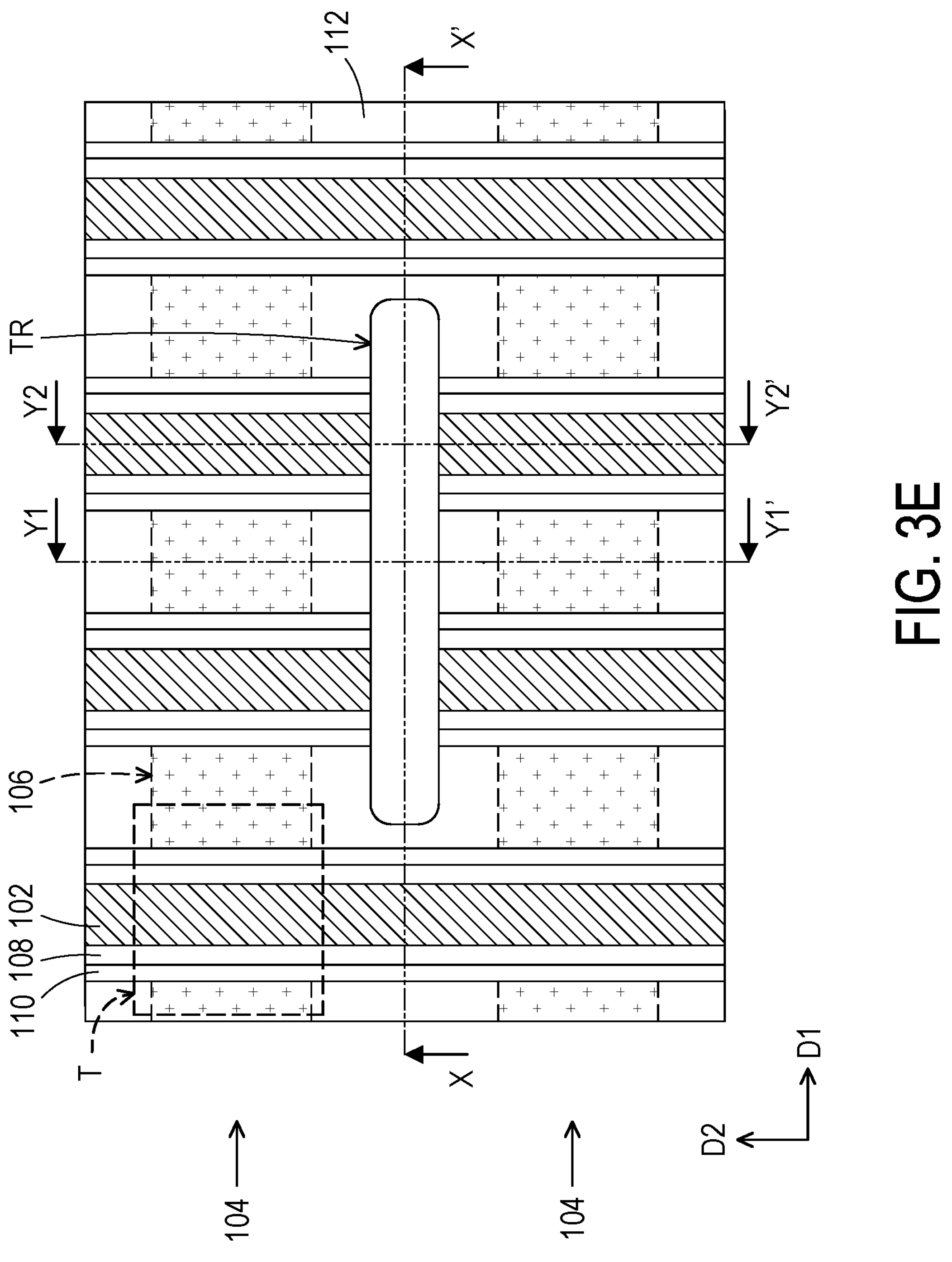

Referring to FIG. 2 and FIG. 3E through FIG. 3H, at a step S202, a trench TR is formed into the current structure. As shown in FIG. 3E, the trench TR is positioned between adjacent channel structures 104, and continuously extends across adjacent gate structures 102, to cut each of these gate structures 102 into separate sections. Along with segmentation of these gate structures 102, the sidewall spacers 108 and portions of the etching stop layer 110 lining along these gate structures 102 are cut by the trench TR as well. In addition, opposite ends of the trench TR at opposite sides of the segmented gate structures 102 are respectively surrounded by a portion of the interlayer dielectric 112, and a section of the trench TR extending in between the segmented gate structures 102 cuts through a portion of the interlayer dielectric 112 filled in between the segmented gate structures 102.

Figure 3F:
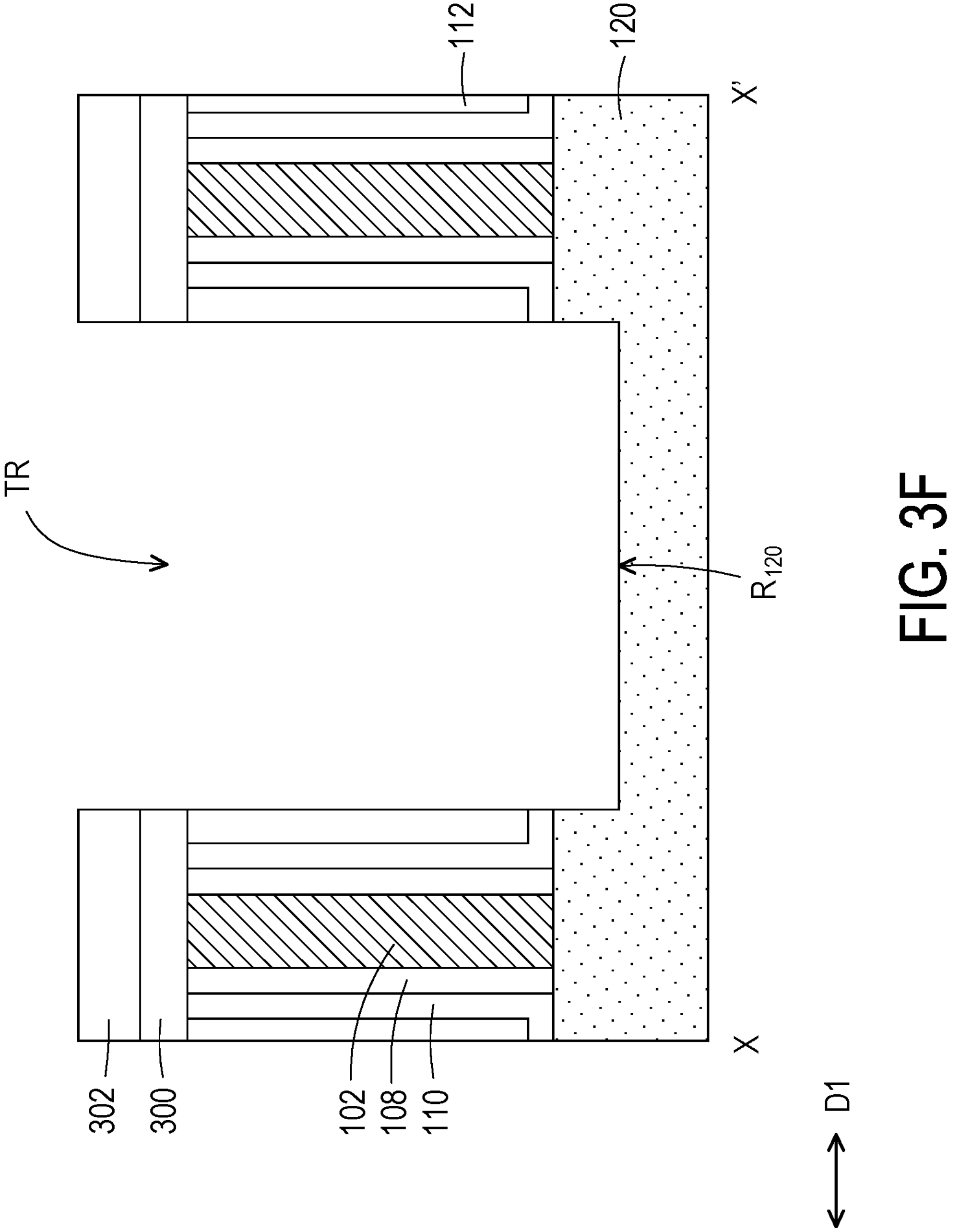
Figures 3G, 3H:
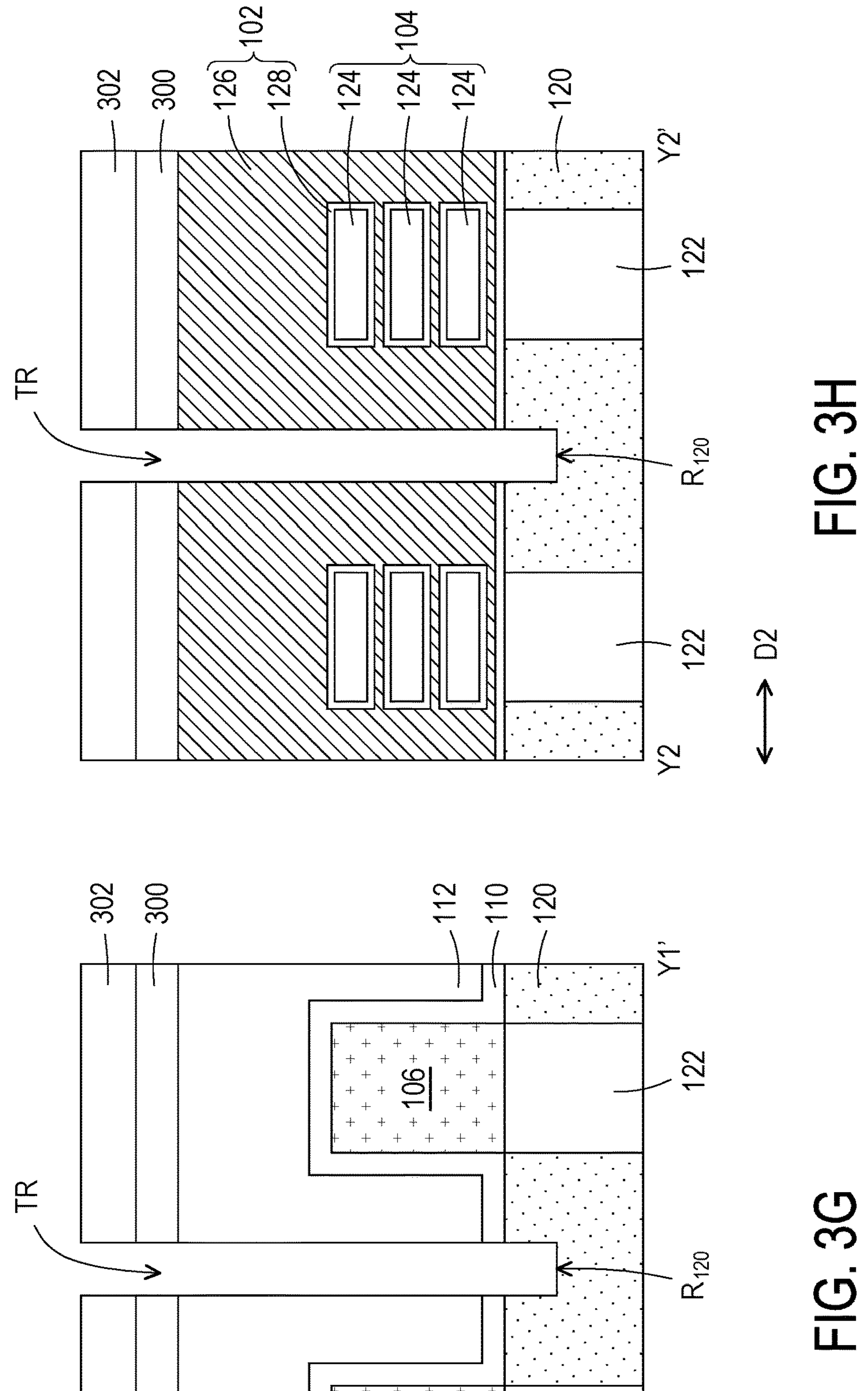
Figure 3I:
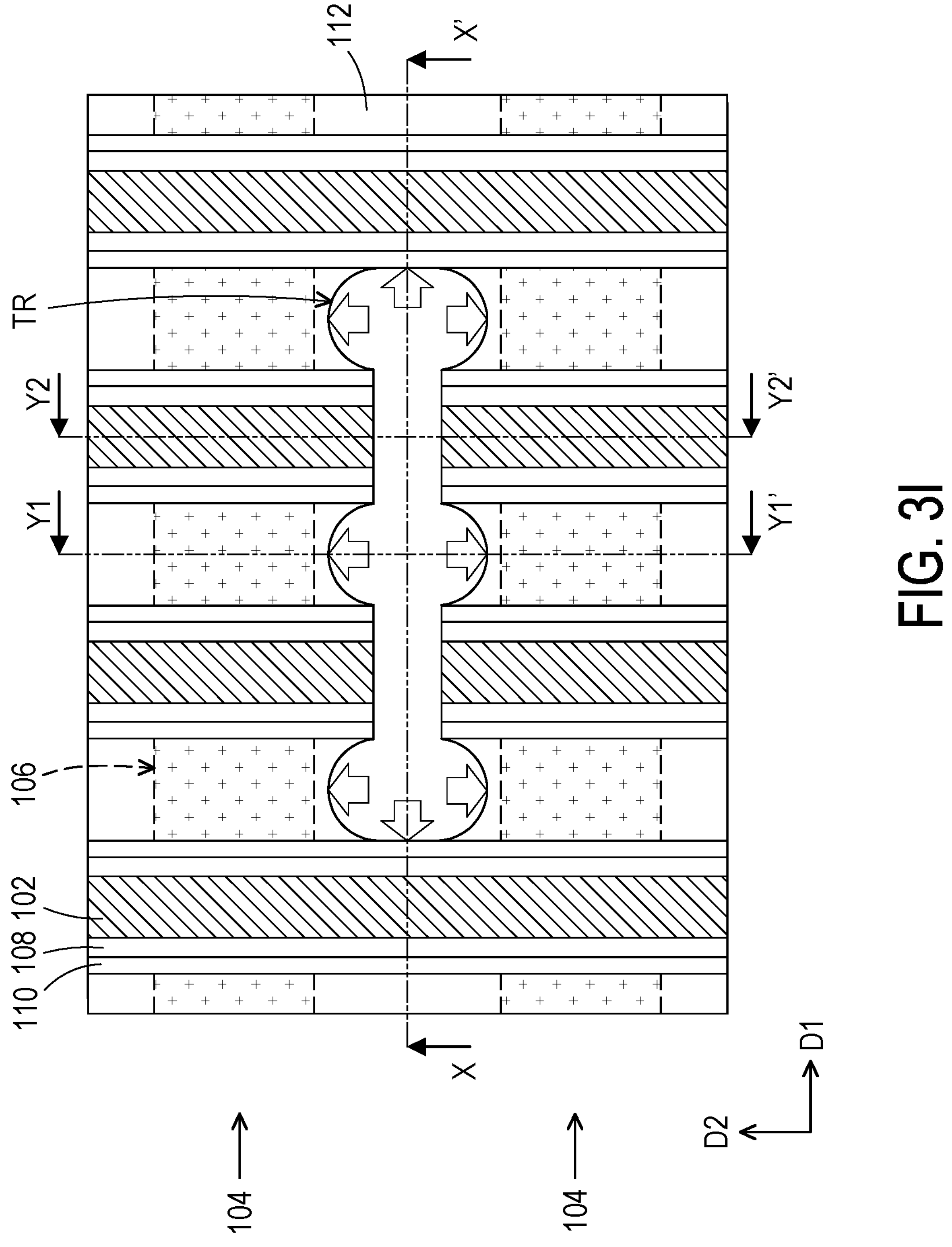

As shown in FIG. 3F and FIG. 3G, the trench TR penetrates through the interlayer dielectric 112 and the etching stop layer 110. As indicated by FIG. 3H, the gate structures 102 intersected with the trench TR are segmented by the trench TR. In addition, as shown in FIG. 3F, FIG. 3G and FIG. 3H, the trench TR further extends into the trench isolation structure 120. As a result, the trench isolation structure 120 is partially recessed to form the recess $R_{120}$.

In order to form the trench TR, a stack of mask patterns 300, 302 may be formed on the previously provided FETs T and the interlayer dielectric 112. An opening penetrating through the mask patterns 300, 302 defines location, size and shape of the trench TR. During an etching process for forming the trench TR, the mask patterns 300, 302 are functioned as a shadow mask. A portion of the structure overlapped with the opening is etched to form the trench TR, while other portions of the structure shielded by the mask patterns 300, 302 are prevented from being removed. In some embodiments, the mask pattern 300 is a hard mask pattern, while the mask pattern 302 is a photoresist pattern. Further, after formation of the trench TR, the mask pattern 302 may be removed, whereas the mask pattern 300 may remain.

Referring to FIG. 2 and FIG. 3I through FIG. 3L, at a step S204, portions of the trench TR between adjacent gate structures 102 are expanded, while other portions of the trench TR crossing the segmented gate structures 102 substantially remain the same size. These selectively expanded portions of the trench TR include opposite end portions of the trench TR, and include a portion of the trench TR between the segmented gate structures 102. As indicated by the thick arrows in FIG. 3I and FIG. 3J, the end portions of the trench TR may expand along a length direction (e.g., the first lateral direction D1) and a width direction (e.g., the second lateral direction D2), until being in contact with portions of the etching stop layer 110 lining along nearest gate structures 102. On the other hand, as indicated by the thick arrows in FIG. 3I and FIG. 3K, the portion of the trench TR extending between the segmented gate structures 102 may mainly expand along the width direction (e.g., the second lateral direction D2), and may remain laterally spaced apart from nearest source/drain structures 106.

Figure 3J:
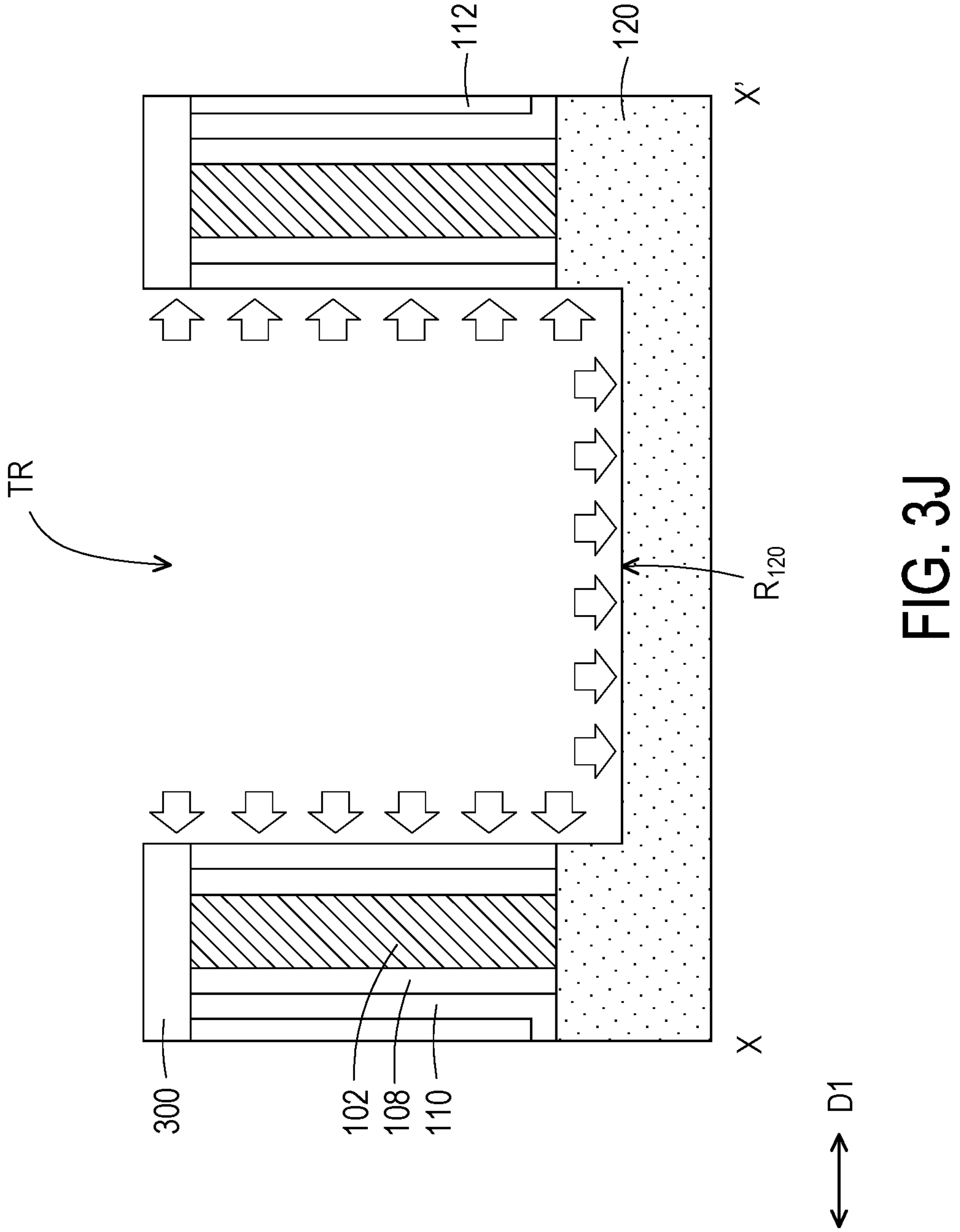
Figures 3K, 3L:
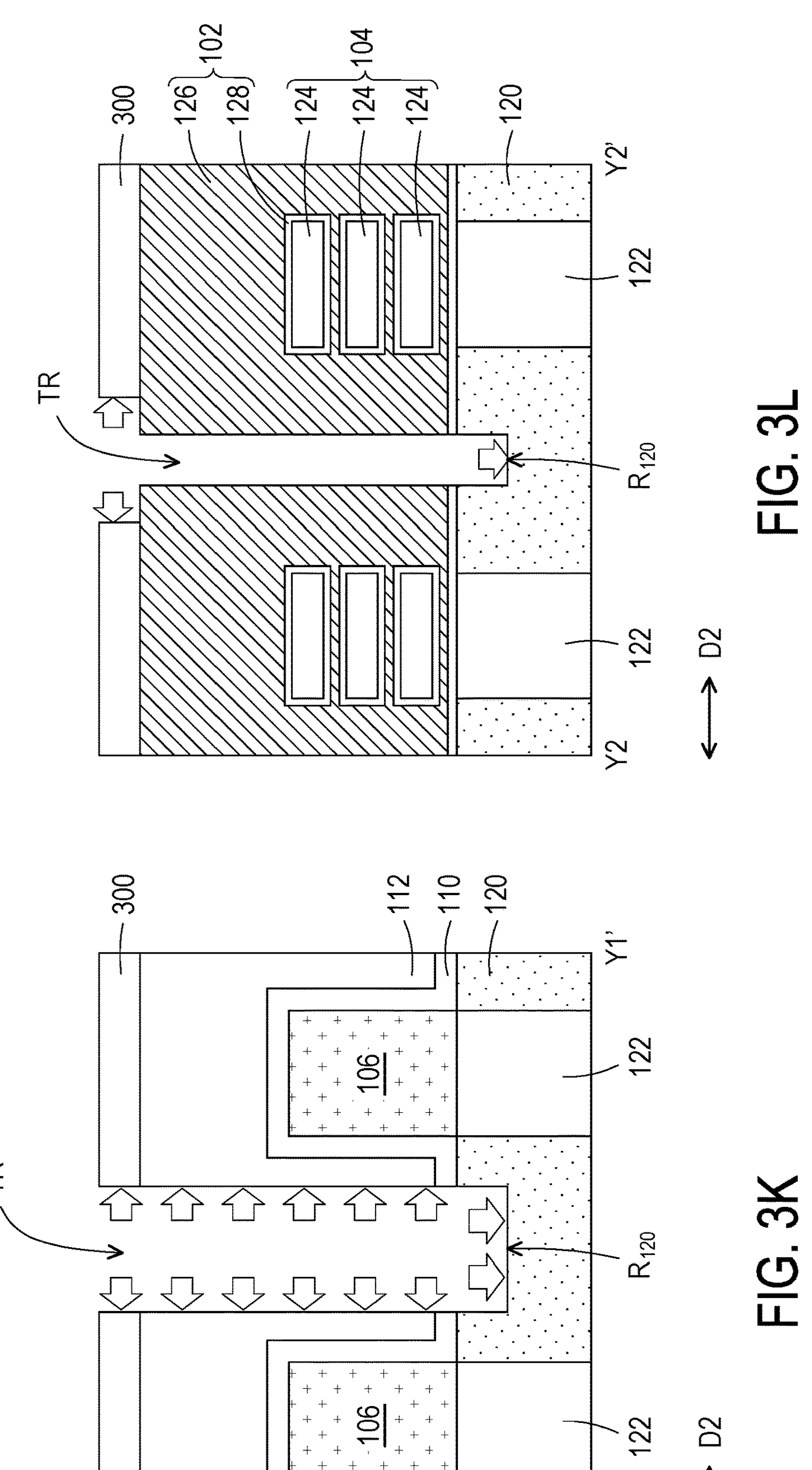

As shown in FIG. 3J, FIG. 3K and FIG. 3L, in addition to selectively expanding along lateral directions in the interlayer dielectric 112, the trench TR may extend deeper into the trench isolation structure 120. Further, as similar to the lateral expansion in the interlayer dielectric 112, the portions of the trench TR between the gate structures 102 may extend laterally in the trench isolation structure 120 (shown in FIG. 3J and FIG. 3K). On the other hand, the portions of the trench TR crossing the segmented gate structures 102 may barely expand (along lateral direction(s)) in the trench isolation structure 120, as shown in FIG. 3L. As a result, the recess $R_{120}$ of the trench isolation structure 120 becomes greater in depth, and is selectively expanded.

An isotropic etching process may be used for selectively expanding the trench TR. During the etching process, the interlayer dielectric 112 and the trench isolation structure 120 may be laterally recessed from the portions of the trench TR between the gate structures 102, and the trench isolation structure 120 may be recessed deeper. Meanwhile, due to etching selectivity, the segmented gate structures 102 as well as the sidewall spacers 108 and portions of the etching stop layer 110 lining along may be barely recessed from the portions of the trench TR crossing the segmented gate structures 102. As being shielded, portions of the trench isolation structure 120 lying below the segmented gate structures 102 may not be laterally recessed from the portions of the trench TR crossing the segmented gate structures 102 as well. Since a lithography process is not required for selectively expanding the trench TR, the selective expansion of the trench TR can be considered as a self-aligning process.

Moreover, as shown in FIG. 3J, FIG. 3K and FIG. 3L, the opening extending through the mask pattern 300 may be unselectively expanded during the etching process for selectively expanding the trench TR.

Referring to FIG. 2 and FIG. 3M through FIG. 3P, at a step S206, the trench TR is filled with a dielectric material 304. Particularly, the dielectric material 304 does not completely fill out the trench TR. As the selectively expanded portions of the trench TR are larger in size as compared to other portions of the trench TR, portions of the dielectric material 304 filled in each of the selectively expanded portions of the trench TR may not merge to form an entirely solid structure. Instead, a deep hole DH may be left unoccupied by the dielectric material 304 in each of the selectively expanded portions of the trench TR. On the other hand, the unexpanded portions of the trench TR crossing the segmented gate structures 102 may be fully filled by the dielectric material 304.

Figure 3M:
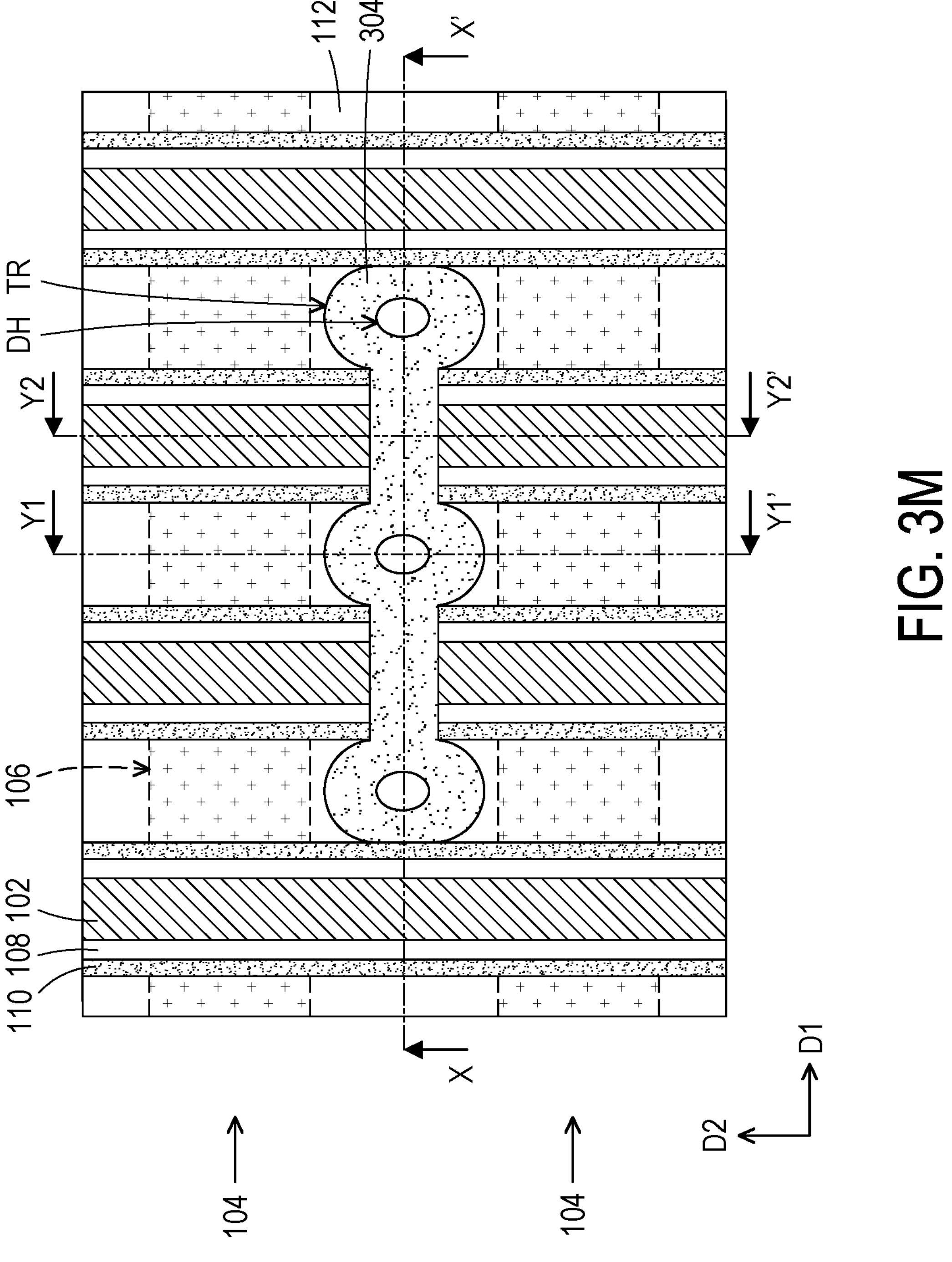
Figure 3N:
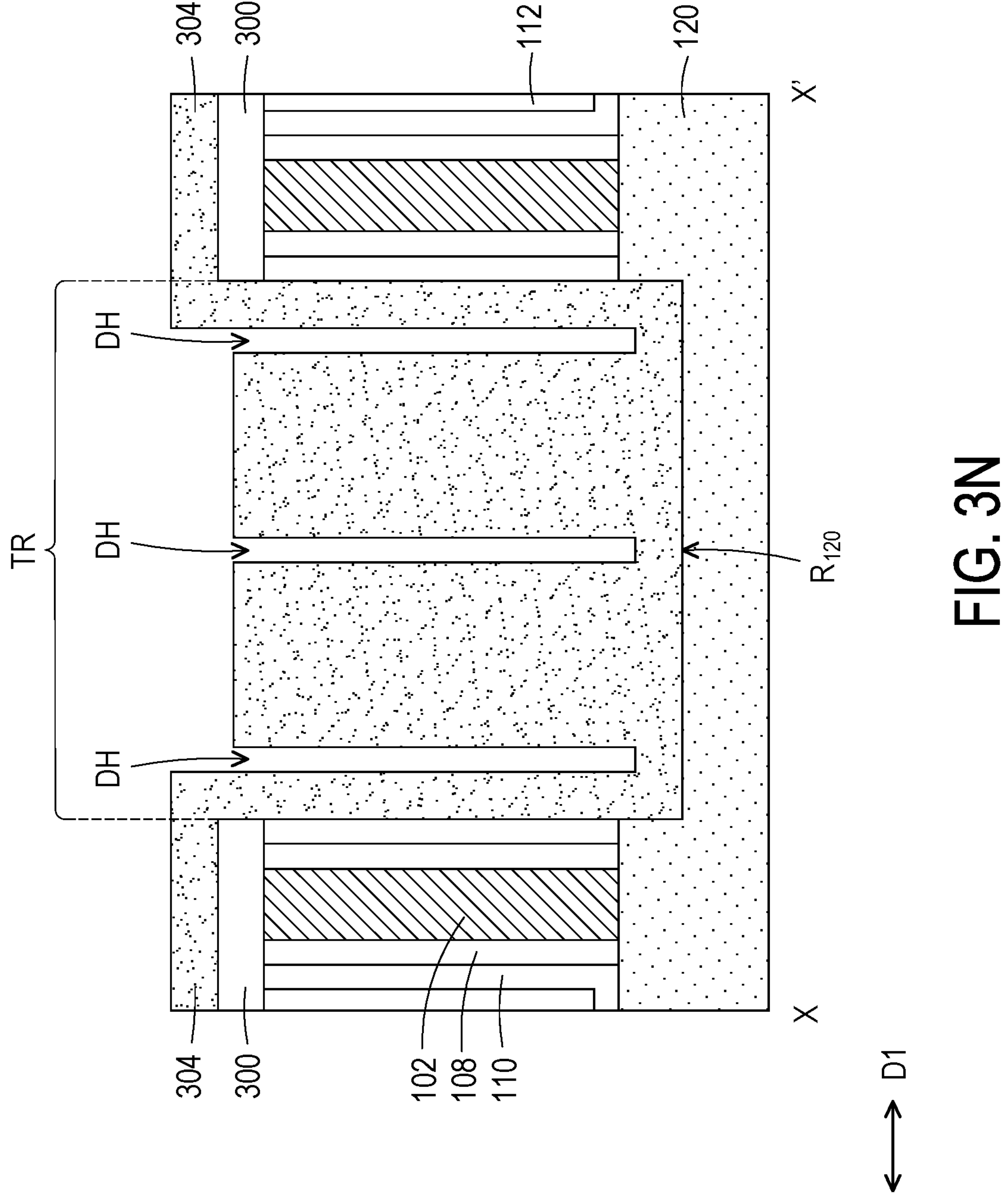
Figure 3P:
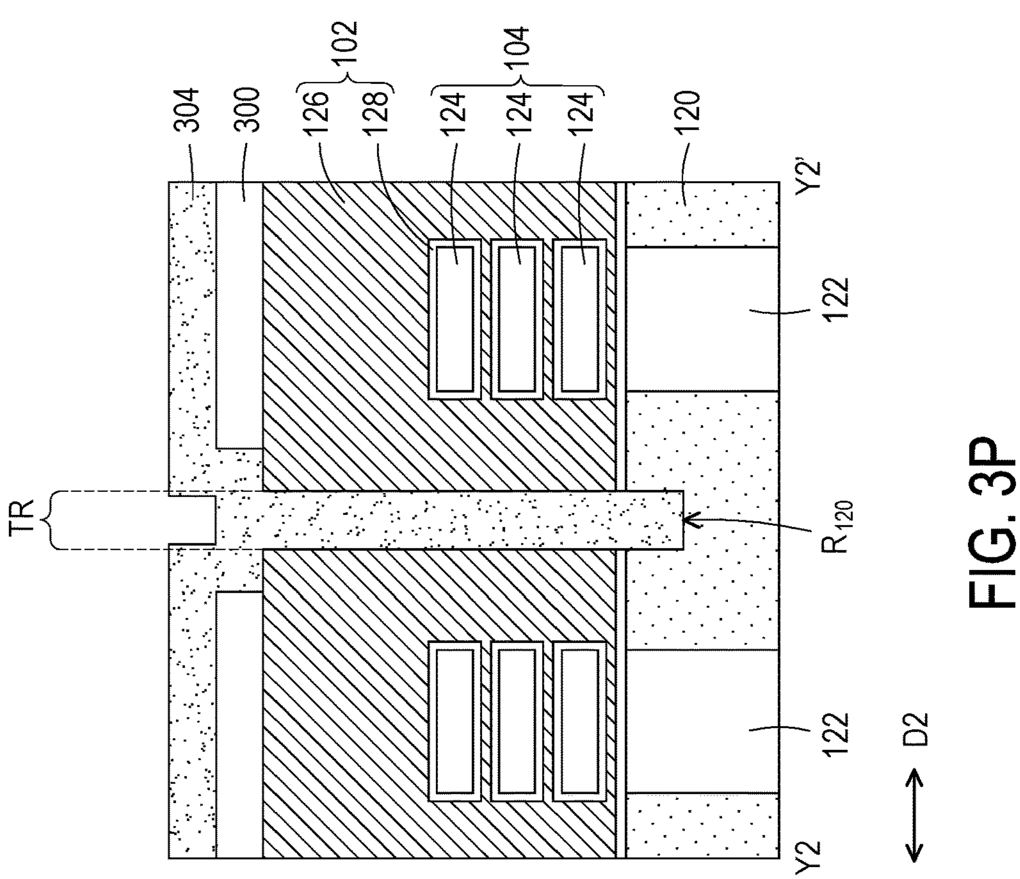
Figure 3O:
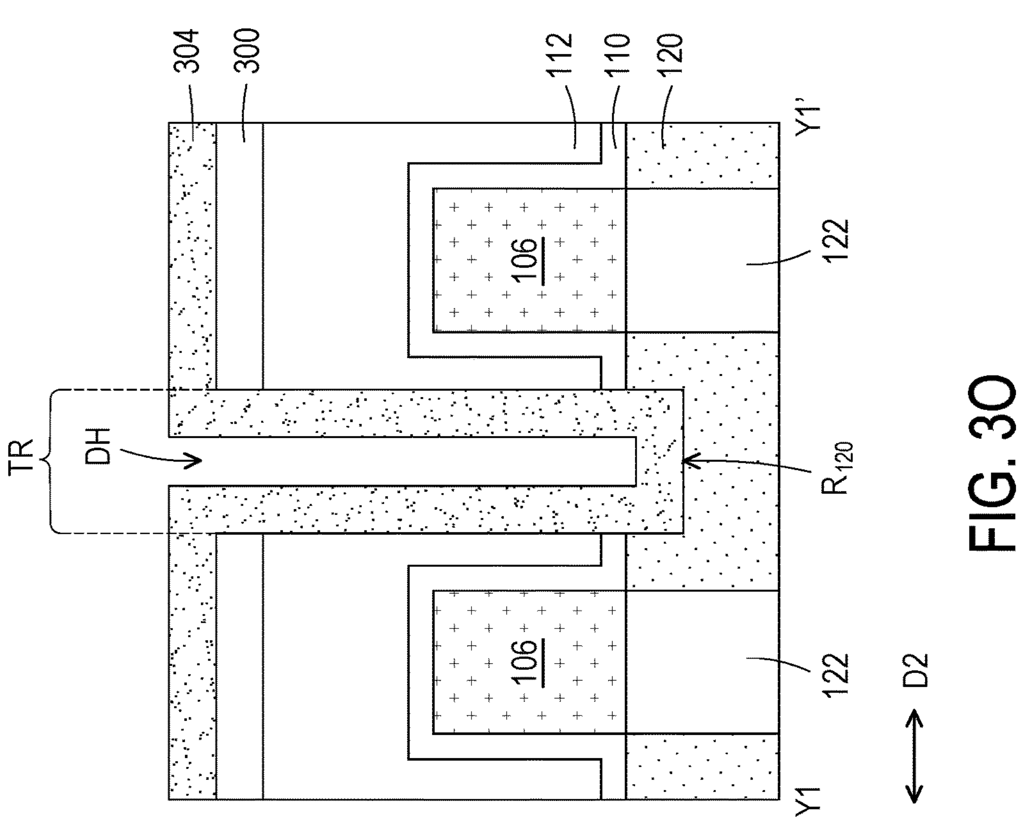
Figure 3Q:
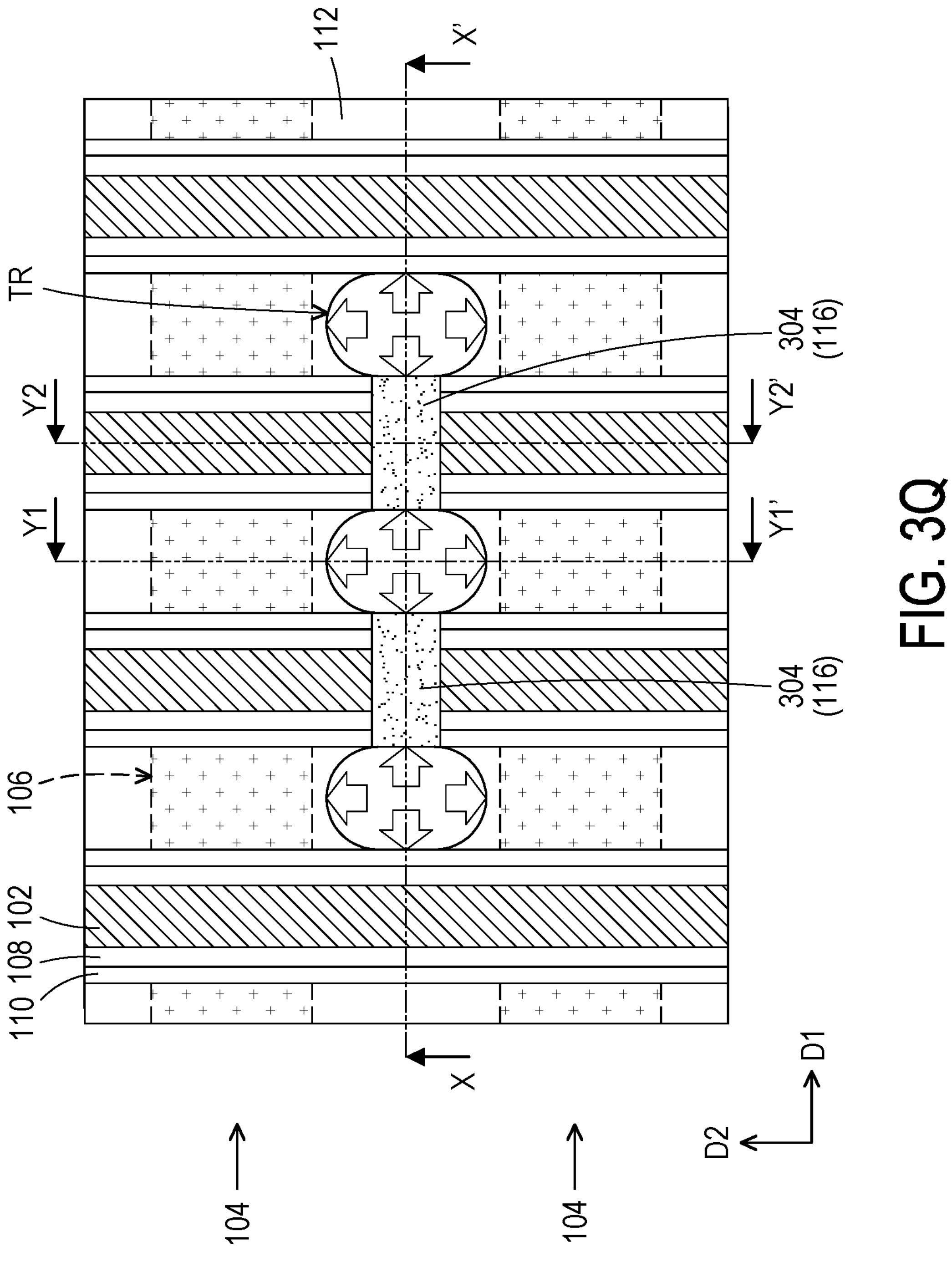

As shown in FIG. 3M, FIG. 3N and FIG. 3O, the deep holes DH are each defined by a recessed structure of the dielectric material 304, and respectively have an open end at a top side. Further, as shown in FIG. 3M through FIG. 3P, the dielectric material 304 may further extend onto a top surface of the mask pattern 300 through the opening laterally surrounded by the mask pattern 300. A deposition process, such as an atomic layer deposition (ALD) process may be used for forming the dielectric material 304. As will be further described, the dielectric material 304 will be patterned to form the isolation wall 116 described with reference to FIG. 1A through FIG. 1D.

Referring to FIG. 2 and FIG. 3Q through FIG. 3T, at a step S208, the portions of the dielectric material 304 filled in the selectively expanded portions of the trench TR are removed, while the portions of the dielectric material 304 in the unexpanded portions of the trench TR remain. Consequently, openings are formed in the expanded portions of the trench TR. As indicated by the thick arrows in FIG. 3Q, the deep holes DH in the expanded portions of the trench TR gradually expand during the partial removal of the dielectric material 304, until the portions of the dielectric material 304 in the expanded portions of the trench TR are removed. As being confined in a rather small space, the portions of the dielectric material 304 filled in the portions of the trench TR crossing the segmented gate structures 102 is less susceptible to removal, thus remain and form the separate line sections of the isolation wall 116 described with reference to FIG. 1A through FIG. 1D.

An isotropic etching process may be used for patterning the dielectric material 304. During the etching process, etchants may enter the deep holes DH extending into the portions of the dielectric material 304 in the expanded portions of the trench TR, and begin to react with these portions of the dielectric material 304, till these portions of the dielectric material 304 are removed. On the other hand, as other portions of the dielectric material 304 are confined in narrow portions of the trench TR crossing the segmented gate structures 102, the etchants may hardly react with these portions of the dielectric material 304. Therefore, these portions of the dielectric material 304 filled in the portions of the trench TR crossing the segmented gate structures 102 remain, and form the separate line sections of the isolation wall 116. In some embodiments, the dielectric material 304 to be patterned to form the isolation wall 116 has sufficient etching selectivity with respect to the interlayer dielectric 112 and the trench isolation structure 120. In these embodiments, the trench TR may not be further expanded nor become deeper during the etching process. As an example, the dielectric material 304 may be formed of silicon nitride, whereas the interlayer dielectric 112 and the trench isolation structure 120 may be formed of silicon oxide.

Figure 3R:
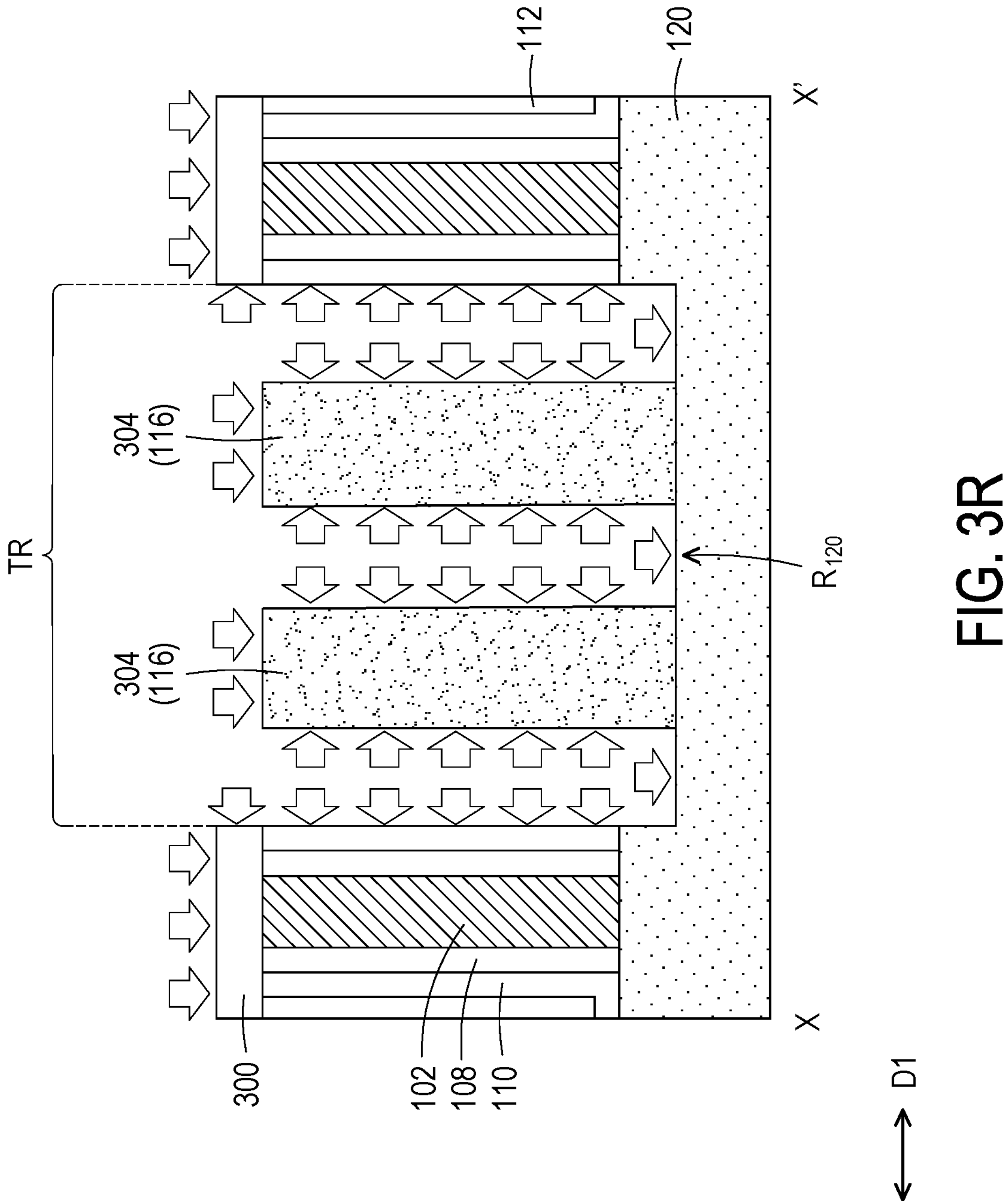
Figures 3S, 3T:
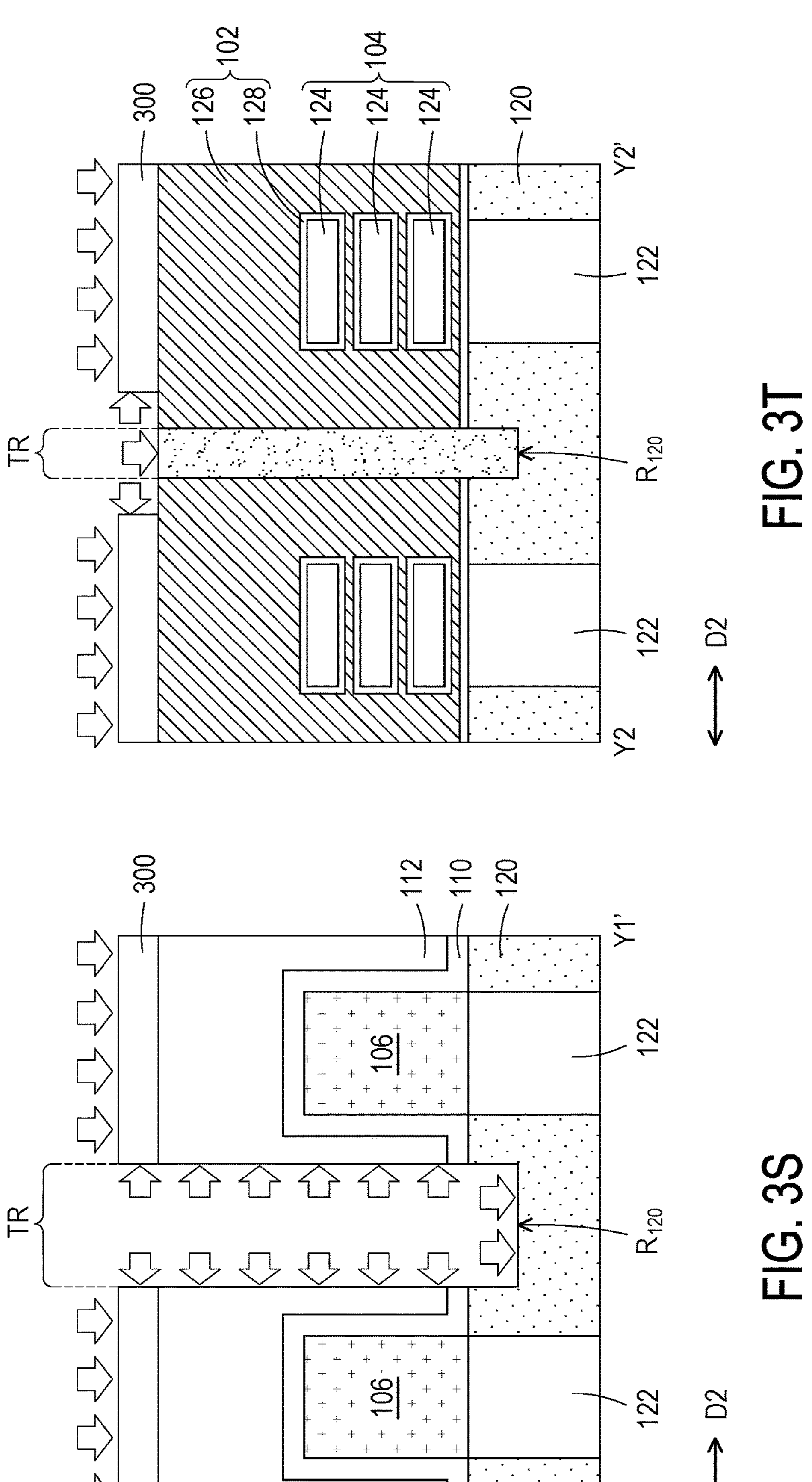
Figure 3U:
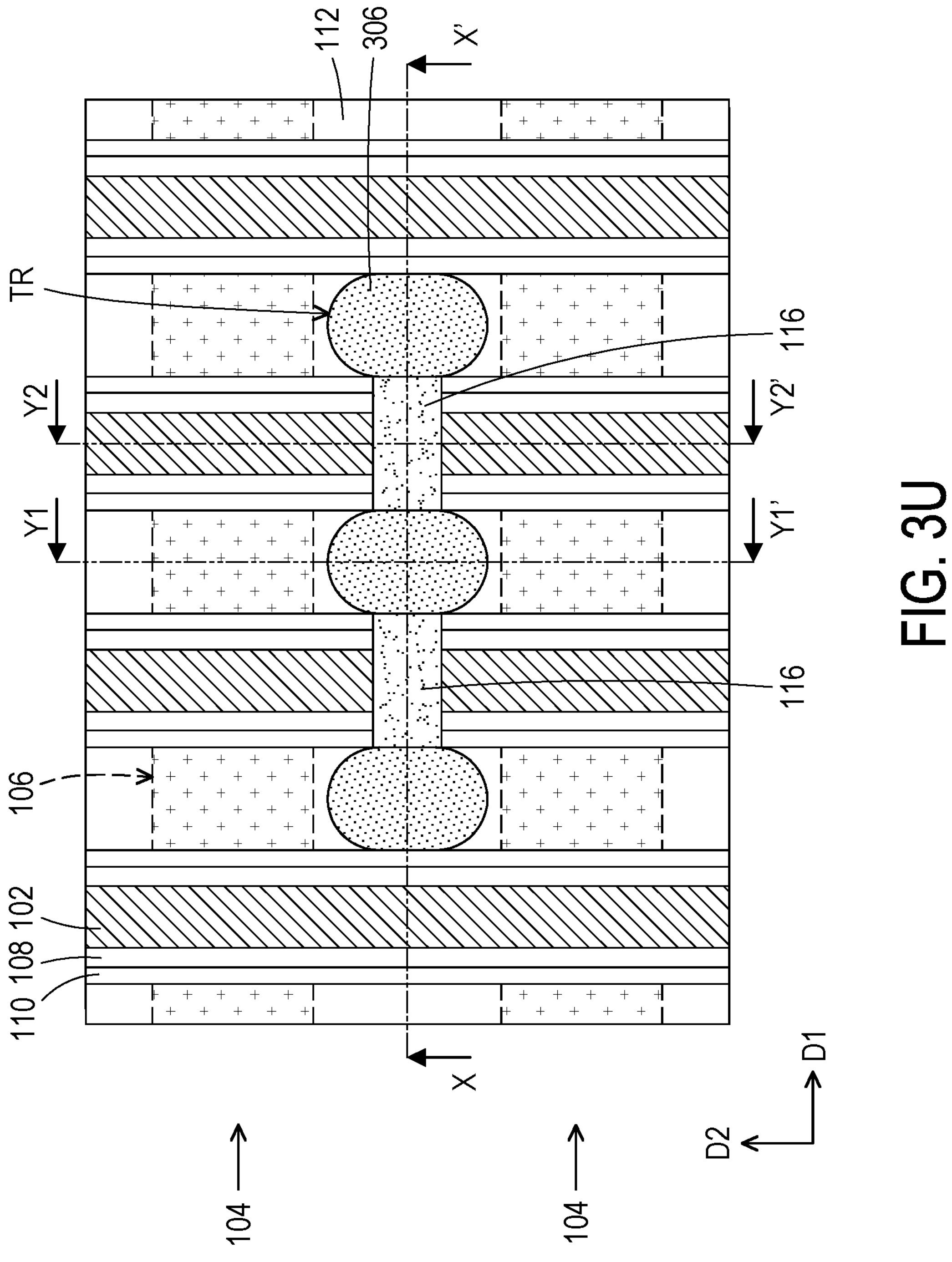

Furthermore, as shown in FIG. 3R, FIG. 3S and FIG. 3T, portions of the dielectric material 304 covering the top surface of the mask pattern 300 as well as portions of the dielectric material 304 filled in the opening laterally surrounded by the mask pattern 300 may also be removed. The remained portions of the dielectric material 304, which form the separate line sections of the isolation wall 116, may have top surfaces substantially coplanar with, slightly higher than or slightly lower than an interface between the mask pattern 300 and the gate structures 102.

Figure 3V:
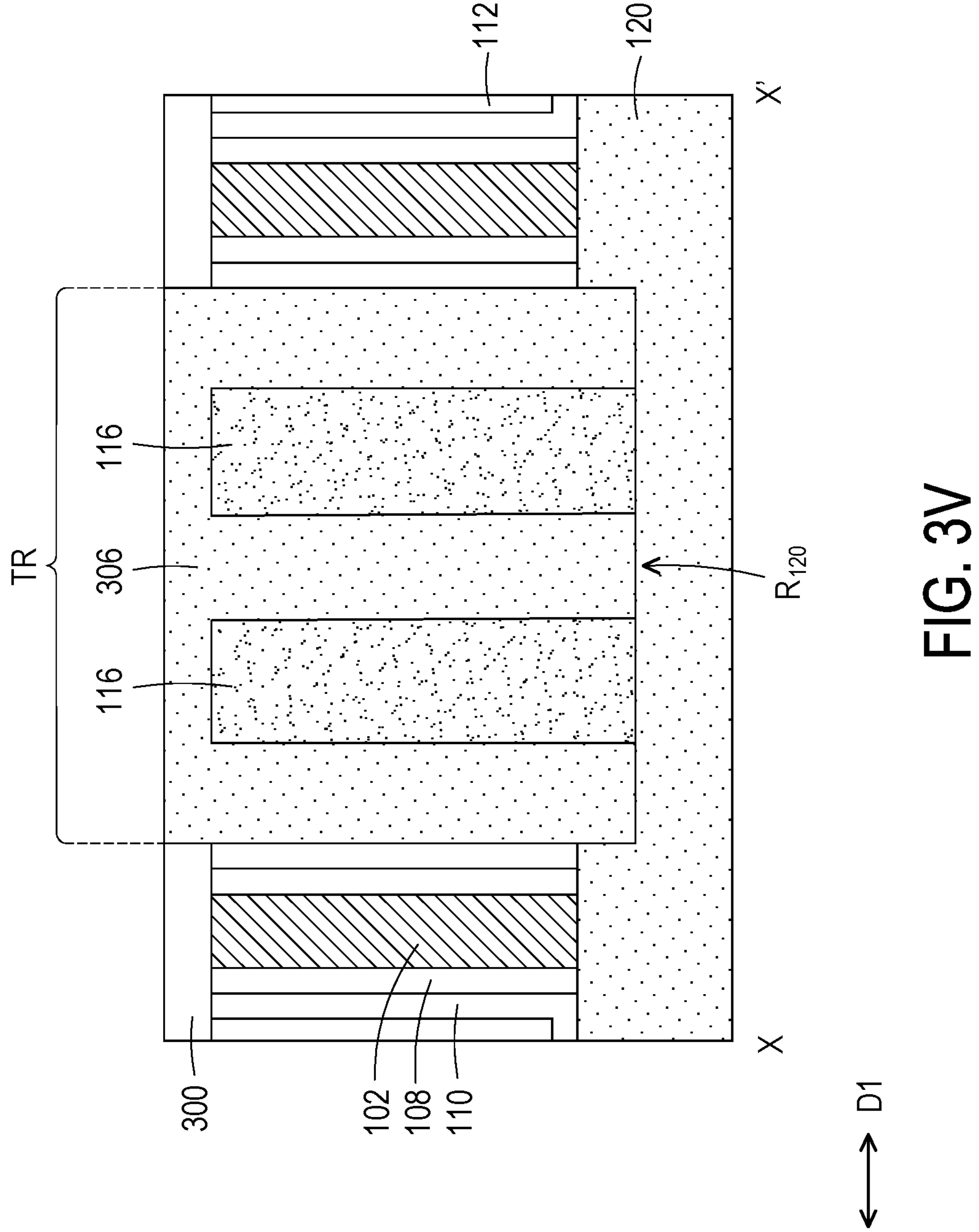
Figures 3W, 3X:
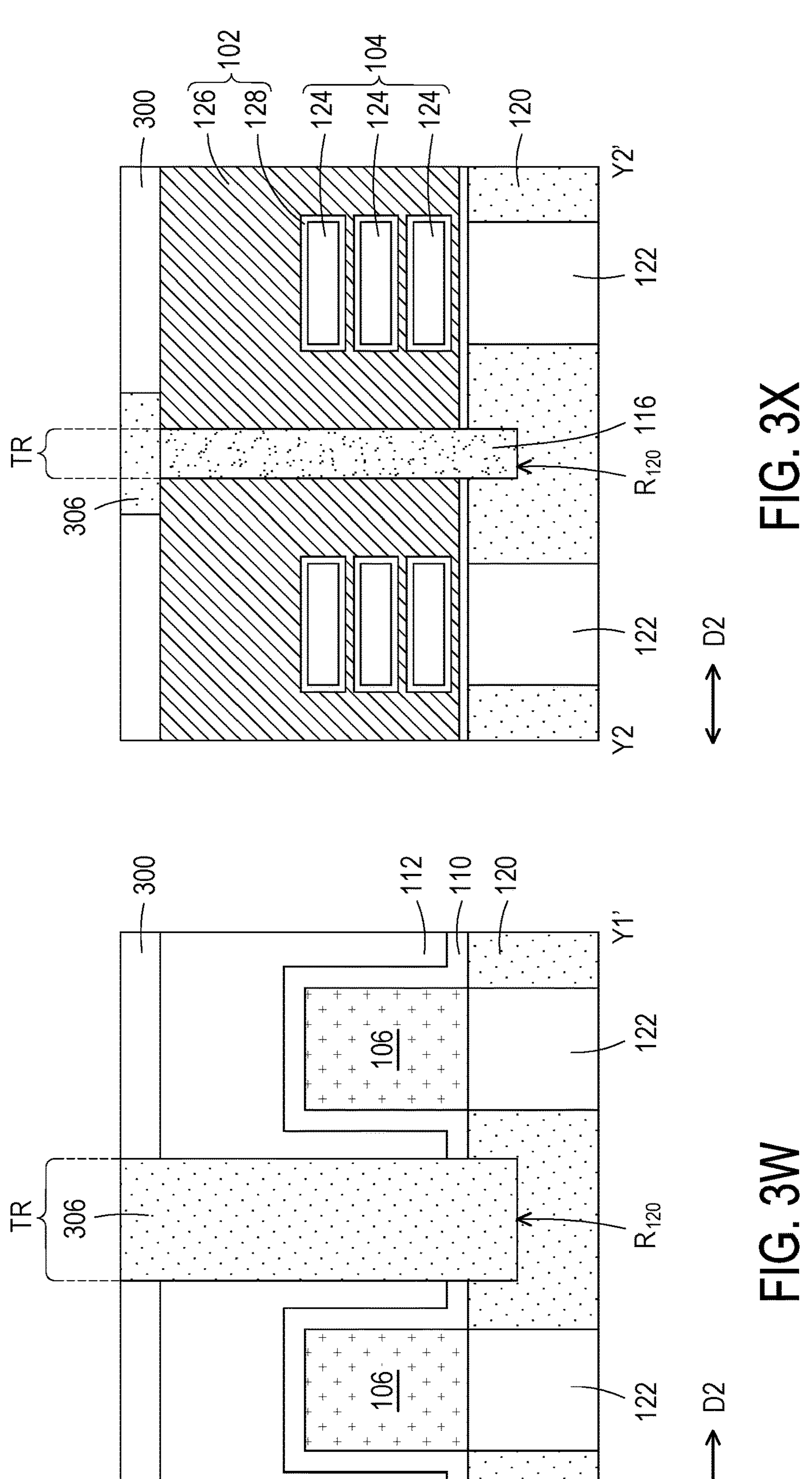

Referring to FIG. 2 and FIG. 3U through FIG. 3X, at a step S210, the openings in the trench TR are filled by a dielectric material 306. As described above, the trench TR is initially filled by the dielectric material 304, then the dielectric material 304 is partially removed, and separate openings are resulted in the trench TR. Currently, the dielectric material 306 is formed in these openings, and the trench TR is refilled. As shown in FIG. 3V, FIG. 3W and FIG. 3X, the dielectric material 306 may fill the opening laterally surrounded by the mask pattern 300, and may be formed to a height substantially leveled with a top surface of the mask pattern 300, which is elevated from top surfaces of the isolation wall 116. That is, in addition to be in lateral contact with the dielectric material 306, the isolation wall 116 may be further covered by the dielectric material 306. In the following step, the portion of the dielectric material 306 covering the isolation wall 116 will be removed. According to some embodiments, a deposition process (e.g., a CVD process) and a planarization process are involved in formation of the dielectric material 306.

Referring to FIG. 2 and FIG. 1A through FIG. 1D, at a step S212, the dielectric material 306 is patterned to form the dielectric structures 114. To be more specific, the portion of the dielectric material 306 filled in the opening surrounded by the mask pattern 300 and covering the isolation wall 116 is removed, while other portions of the dielectric material 306 in lateral contact with the isolation wall 116 remain and form the dielectric structures 114. Further, the mask pattern 300 may be removed along with the top portion of the dielectric material 306. A planarization process may be used for patterning the dielectric material 306 and removing the mask pattern 300.

Further, at a step S214, the lateral contact structure 118 is formed into a portion of the interlayer dielectric 112 and the one of the dielectric structures 114 between the segmented gate structures 102, to establish electrical contact with adjacent ones of the source/drain structures 106 between the segmented gate structures 102. As indicated in FIG. 1B and FIG. 1C, the lateral contact structure 118 is formed in a shallow trench recessing into the portion of the interlayer dielectric 112 and the one of the dielectric structures 114. In addition, the shallow trench and the lateral contact structure 118 therein may further penetrate through portions of the etching stop layer 110 covering the source/drain structures 106, such that the lateral contact structure 118 can make contact with the source/drain structures 106. A method for forming the shallow trench may include a lithography process and a following etching process. In addition, forming the lateral contact structure 118 in the shallow trench may include a deposition process and a possible planarization process.

Up to here, the portion of the integrated circuit 10 described with reference to FIG. 1A through FIG. 1D has been formed. Although not shown, an interconnection structure may be further formed on this structure, to provide interconnections for the FETs T. Particularly, a lower level of the interconnection structure may be laid with local interconnections, while an upper level of the interconnection structure may deployed with global interconnections. As the lateral contact structure 118 can extend continuously without being cut into separate pieces by the isolation wall 116, additional local interconnections for restoring conduction path of the lateral contact structure 118 are not required. Therefore, the lower level of the interconnection structure, which might be very crowded, may be at least partly released.

Figure 4B:
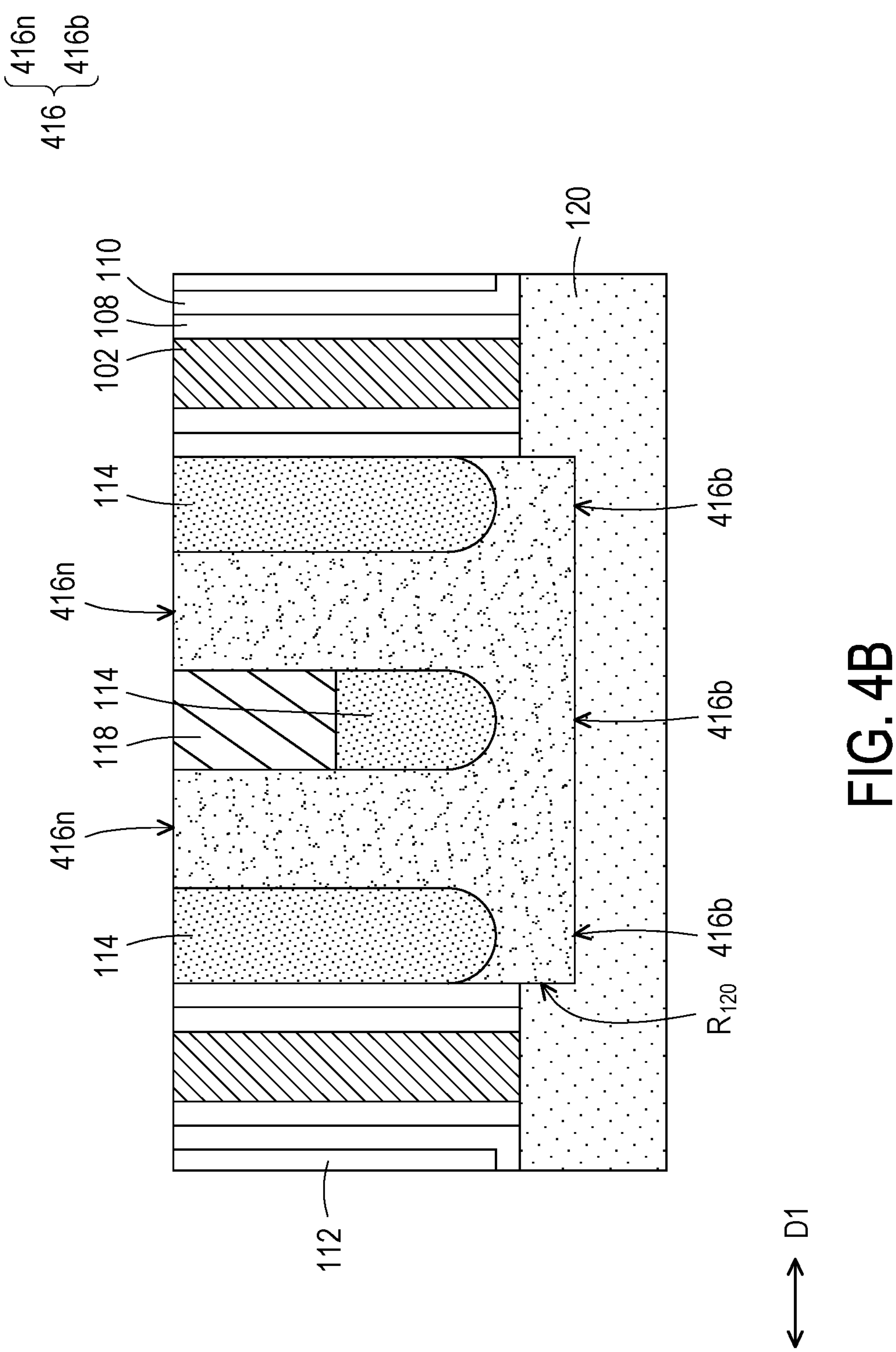
FIG. 4B is a schematic cross-sectional view along the isolation wall as shown in FIG. 4A.
Figure 4C:
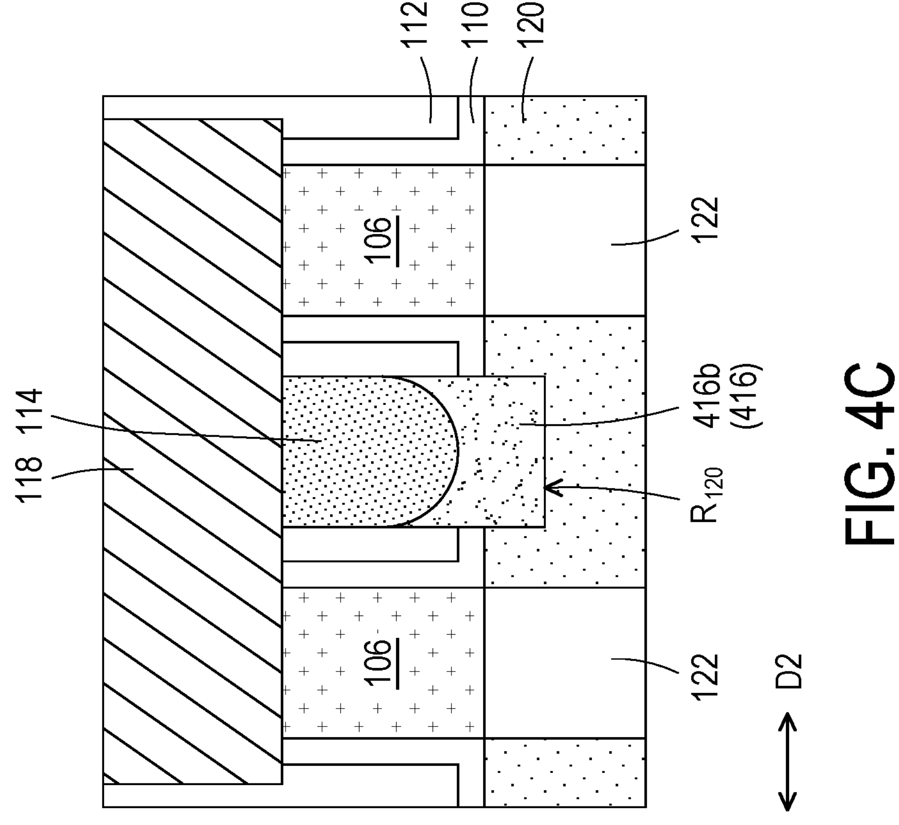
FIG. 4C is a schematic cross-sectional view along the lateral contact structure shown in FIG. 4A.

FIG. 4A is a schematic plan view illustrating an isolation wall 416, along with the gate structures 102 cut by the isolation wall 416 and the lateral contact structure 118 extending between the segmented gate structures 102, according to some embodiments of the present disclosure. FIG. 4B is a schematic cross-sectional view along the isolation wall 416. FIG. 4C is a schematic cross-sectional view along the lateral contact structure 118. The embodiments to be described with reference to FIG. 4A through FIG. 4C are similar to the embodiments described with reference to FIG. 1A through FIG. 1D. Only differences therebetween will be discussed, the same or the like parts would not be repeated again.

As similar to the isolation wall 116 described above, the isolation wall 416 laterally extends through adjacent ones of the gate structures 102 (as well as the sidewall spacers 108 and portions of the etching stop layer 110 lining along), without cutting the intersecting lateral contact structure 118 into separate portions. As a difference from the isolation wall 116, narrow portions 416*n* of the isolation wall 416 crossing the segmented gate structures 102 are connected between broad portions 416*b* of the isolation wall 416 at opposite sides of each segmented gate structure 102. The narrow portions 416*n* of the isolation wall 416 are each identical with one of the line sections of the isolation wall 116 described with reference to FIG. 1A through FIG. 1D. On the other hand, each of the broad portions 416*b* of the isolation wall 416 may have a contour substantially aligned with a contour of the overlying dielectric structure 114 (shown in FIG. 4B and FIG. 4C). That is, size of each broad portion 416*b* of the isolation wall 416 may match size of each dielectric structure 114 described with reference to FIG. 1A through FIG. 1D.

As shown in FIG. 4B, the lateral contact structure 118 extends in between the narrow portions 416*n* of the isolation sidewall 416. In addition, the broad portions 416*b* of the isolation wall 416 are laterally connected through the narrow portions 416*n* of the isolation wall 416. Further, the broad portions 416*b* of the isolation wall 416 respectively lie below one of the dielectric structures 114. As also shown in FIG. 4C, one of the broad portions 416*b* of the isolation wall 416 crossed over by the lateral contact structure 118 is vertically separated from the lateral contact structure 118 through one of the dielectric structures 114 shorter than the others. On the other hand, the taller ones of the dielectric structures 114 are filled to a height substantially leveled with top surfaces of the narrow portions 416*n* of the isolation wall 416, a top surface of the lateral contact structure 118, top surfaces of the gate structures 102 and topmost ends of the sidewall spacers 108 and the etching stop layer 110. In some embodiments, the narrow portions 416*n* and the broad portions 416*b* of the isolation wall 416 both protrude into the trench isolation structure 120, and the trench isolation structure 120 is recessed correspondingly, to form the recess $R_{120}$. Further, in some embodiments, the broad portions 416*b* of the isolation wall 416 have concave top surfaces. Correspondingly, the dielectric structures 114 may have convex bottom surfaces.

Method for forming the isolation wall 416 is identical with the method for forming the isolation wall 116 described above, except that the portions of the dielectric material 304 in the expanded portions of the trench TR are not completely removed during the step described with reference to FIG. 3Q through FIG. 3T, and the dielectric material 306 covers the remained dielectric material 304 in the expanded portions of the trench TR during the step described with reference to FIG. 3U through FIG. 3X.

Figure 5A:
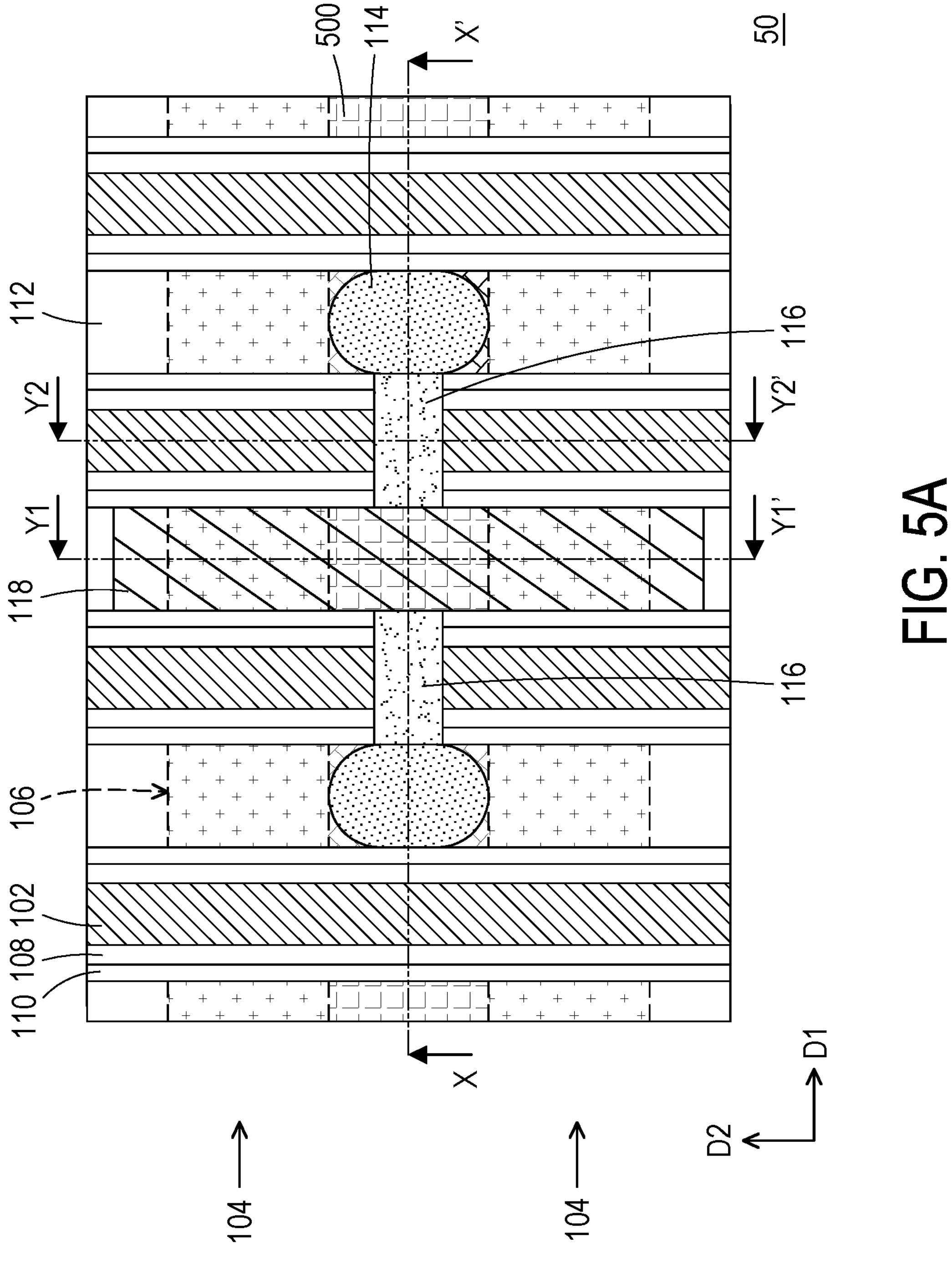
FIG. 5A is a schematic plan view illustrating a portion of an integrated circuit, according to some embodiments of the present disclosure.
Figure 5B:
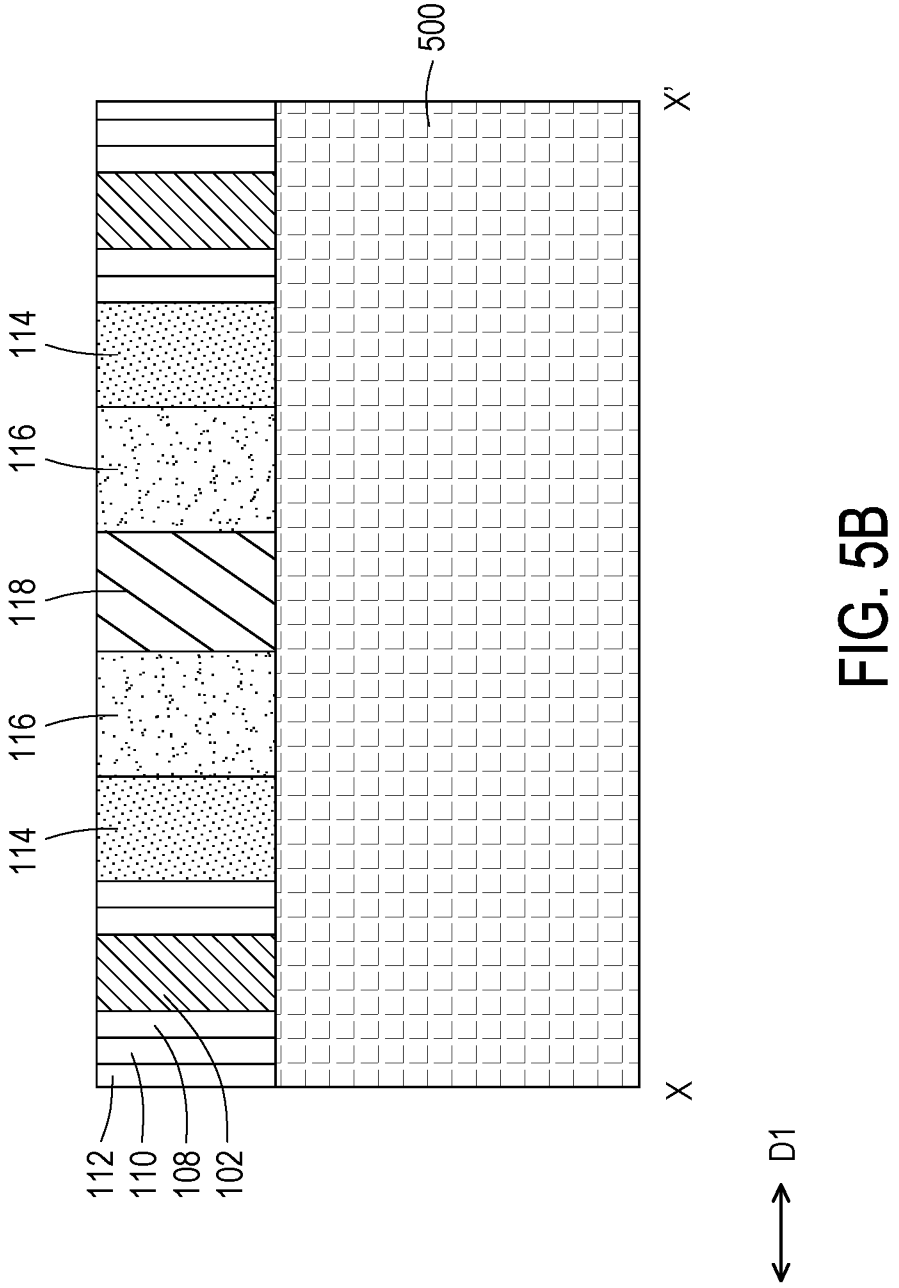
FIG. 5B is a schematic cross-sectional view along a X-X' line shown in FIG. 5A.
Figures 5C, 5D:
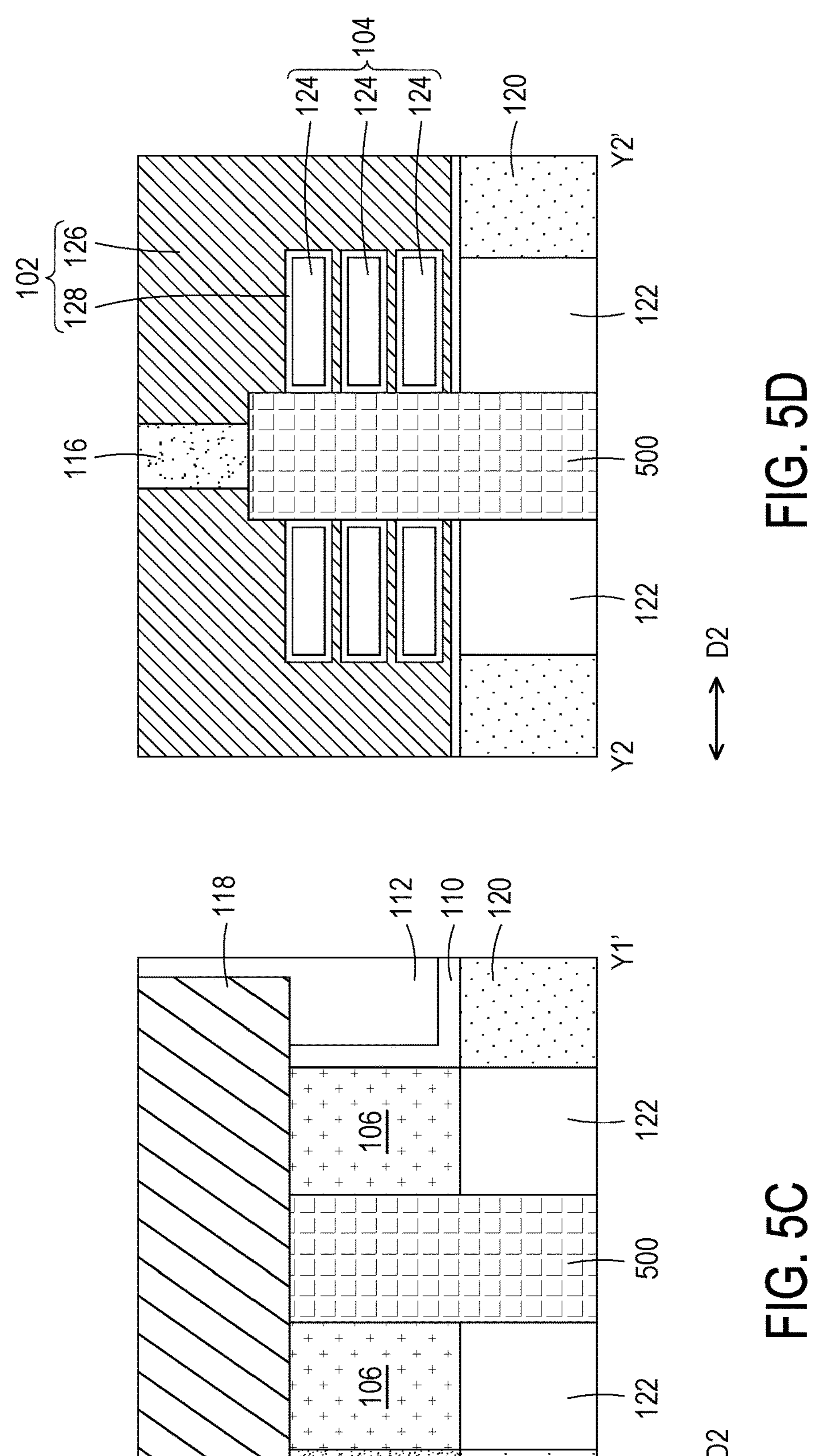
FIG. 5C is a schematic cross-sectional view along a Y1-Y1' line shown in FIG. 5A.
FIG. 5D is a schematic cross-sectional view along a Y2-Y2' line shown in FIG. 5A.

FIG. 5A is a schematic plan view illustrating a portion of an integrated circuit 50, according to some embodiments of the present disclosure. FIG. 5B is a schematic cross-sectional view along a X-X' line shown in FIG. 5A; FIG. 5C is a schematic cross-sectional view along a Y1-Y1' line shown in FIG. 5A; and FIG. 5D is a schematic cross-sectional view along a Y2-Y2' line shown in FIG. 5A.

The embodiments to be described with reference to FIG. 5A through FIG. 5D are similar to the embodiments described with reference to FIG. 1A through FIG. 1D. Only differences therebetween will be discussed, the same or the like parts would not be repeated again.

As shown in FIG. 5A, the integrated circuit 50 further includes dielectric walls 500 (only a single one is shown) each extending between adjacent ones of the channel structures 104 (only indicated by arrows). The gate structures 102 may intersect and cover the dielectric walls 500, and the lateral contact structure 118 may cross one of the dielectric walls 500 from above. Further, the isolation wall 116 and the dielectric structures 114 are formed on the dielectric wall 500.

As shown in FIG. 5A and FIG. 5B, one of the dielectric walls 500 extending in between adjacent channel structures 104 is depicted. The isolation wall 116 and the dielectric structures 114 are formed on this dielectric wall 500, to a height substantially leveled with top surfaces of the gate structures 102 (as well as topmost ends of the sidewall spacers 108 and the etching stop layer 110). In addition, the lateral contact structure 118 extends through a spacing between the line sections of the isolation wall 116, and in contact with the dielectric wall 500 from above. In some embodiments, the lateral contact structure 118 is in contact with the dielectric wall 500 without any of the dielectric structures 114 in between. In these embodiments, each of the line sections of the isolation wall 116 is bounded between the lateral contact structure 118 and one of the dielectric structures 114.

As shown in FIG. 5A and FIG. 5C, the dielectric wall 500 extends into the semiconductor substrate 122. The source/drain structures 106 connected by the lateral contact structure 118 are in lateral contact with the dielectric wall 500 from opposite sides of the dielectric wall 500. In addition, the lateral contact structure 118 continuously extending above the source/drain structures 106 is in contact with a top surface of the dielectric wall 500.

Further, as shown in FIG. 5A and FIG. 5D, the dielectric wall 500 laterally penetrates through the gate structures 102, and is wrapped by the gate structures 102. Accordingly, the dielectric wall 500 is in contact with the gate structures 102 by sidewalls and a top surface. In addition, each line section of the isolation wall 116 cutting through one of the gate structures 102 may stand on top of the dielectric wall 500. Moreover, stacks of the semiconductor sheets 124 laterally protruding from opposite sides of the dielectric wall 500 in the gate structures 102. In some embodiments, the dielectric wall 500 is protruded from topmost ones of these semiconductor sheets 124.

By disposing the dielectric wall 500, a spacing between adjacent channel structures 104 can be further shortened, without compromising isolation therebetween. Therefore, the integrated circuit 50 can be formed with higher density.

As above, a solution for cutting gate structures without breaking lateral contact structure for connecting the source/drain structure between the segmented gate structures is provided. The lateral contact structure has a top surface substantially coplanar with top surfaces of the gate structures. Since the lateral contact structure can be avoided from being cut into separate portions, additional routings for restoring conduction path of the lateral contact structure are no longer required. Therefore, those source/drain structures can be connected via a shortest path, and adding more routings to already crowded interconnection structure may be avoided.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In an aspect of the present disclosure, an integrated circuit is provided. The integrated circuit comprises: first and second gate structures; first and second channel structures, laterally penetrating through the first and second gate structures, respectively; first and second source/drain structures, disposed between the first and second gate structures, and in lateral contact with the first and second channel structures, respectively; an isolation wall, extending in between the first and second source/drain structures, and cutting each of the first and second gate structures into separate portions; and a lateral contact structure, extending in between the first and second gate structures, and connecting the first source/drain structure to the second source/drain structure without being cut by the isolation wall.

In another aspect of the present disclosure, an integrated circuit is provided. The integrated circuit comprises: first and second gate structures, separately arranged along a first lateral direction, and respectively extending along a second lateral direction; first and second source/drain structures, located between the first and second gate structures, and are laterally separated along the second lateral direction; an isolation wall, extending along the first lateral direction in between the first and second source/drain structures, and having a first line section and a second line section laterally separated from the first line section, wherein the first line section cuts the first gate structure into separate portions, and the second line section cuts the second gate structure into separate portions; and dielectric structures, laterally expanding from terminals of each of the first and second line sections of the isolation wall.

In yet another aspect of the present disclosure, an integrated circuit is provided. The integrated circuit comprises: first and second gate structures, separately arranged along a first lateral direction, and respectively extending along a second lateral direction; first and second source/drain structures, located between the first and second gate structures, and are laterally separated along the second lateral direction; an isolation wall, extending along the first lateral direction in between the first and second source/drain structures, and having a first line section, a second line section laterally separated from the first line section and broad portions laterally expanding from and recessed with respect to the first and second line sections, wherein the first line section cuts the first gate structure into separate portions, the second line section cuts the second gate structure into separate portions, and the broad portions are connected with one another via the first and line sections; and dielectric structures, respectively disposed on one of the broad portions of the isolation wall, and are substantially identical with the broad portions of the isolation wall in terms of size and shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:

first and second gate structures;

first and second channel structures, laterally penetrating through the first and second gate structures, respectively;

first and second source/drain structures, disposed between the first and second gate structures, and in lateral contact with the first and second channel structures, respectively;

an isolation wall, extending in between the first and second source/drain structures, and cutting each of the first and second gate structures into separate portions, wherein the isolation wall has a first narrow portion crossing the first gate structure, a second narrow portion crossing the second gate structure and broad portions connected to the first and second narrow portions from opposite side of each of the first and second narrow portions;

a lateral contact structure, extending in between the first and second gate structures, and connecting the first source/drain structure to the second source/drain structure without being cut by the isolation wall; and dielectric structures, respectively disposed on one of the broad portions of the isolation wall, wherein each of the dielectric structures has a contour substantially aligned with the corresponding one of the broad portions of the isolation wall in a plan view.

2. The integrated circuit according to claim 1, wherein a top surface of the lateral contact structure is substantially coplanar with top surfaces of the first and second gate structures.

3. The integrated circuit according to claim 1, wherein a top surface of the isolation wall is substantially coplanar with a top surface of the lateral contact structure.

4. The integrated circuit according to claim 1, wherein the isolation wall has a first line section laterally cutting through the first gate structure, and has a second line section laterally separated from the first line section and laterally cutting through the second gate structure.

5. The integrated circuit according to claim 4, wherein the lateral contact structure continuously extends through a spacing between the first and second line sections of the isolation wall.

6. The integrated circuit according to claim 1, wherein the broad portions are recessed with respect to the first and second narrow portions.

7. The integrated circuit according to claim 6, wherein the lateral contact structure crosses over one of the broad portions of the isolation wall between the first and second narrow portions of the isolation wall.

8. The integrated circuit according to claim 7, wherein the lateral contact structure is vertically spaced apart from the one of the broad portions of the isolation wall.

9. The integrated circuit according to claim 1, wherein the broad portions of the isolation wall are greater in width as compared to the first and second narrow portions of the isolation wall, and the width is a dimension along an extending direction of the first and second gate structures.

10. The integrated circuit according to claim 1, wherein the broad portions of the isolation wall are connected with one another by the first and second narrow portions of the isolation wall.

11. The integrated circuit according to claim 1, wherein one of the dielectric structures disposed between the first and second narrow portions of the isolation wall is recessed with respect to others of the dielectric structures.

12. An integrated circuit, comprising:

first and second gate structures, separately arranged along a first lateral direction, and respectively extending along a second lateral direction;

first and second source/drain structures, located between the first and second gate structures, and are laterally separated along the second lateral direction;

an isolation wall, extending along the first lateral direction in between the first and second source/drain structures, and having a first line section, a second line section laterally separated from the first line section and broad portions laterally expanding from and recessed with respect to the first and second line sections, wherein the first line section cuts the first gate structure into separate portions, the second line section cuts the second gate structure into separate portions, and the broad portions are connected with one another via the first and second line sections; and dielectric structures, respectively disposed on one of the broad portions of the isolation wall, and are substantially identical with the broad portions of the isolation wall in terms of size and shape in a plan view.

13. The integrated circuit according to claim 12, wherein one of the dielectric structures disposed between the first and second line sections of the isolation wall is recessed with respect to others of the dielectric structures.

14. The integrated circuit according to claim 13, further comprising:

a lateral contact structure, continuously extending through a spacing between the first and second line sections of the isolation wall to connect the first source/drain structure to the second source/drain structure, and crossing the one of the dielectric structures from above.

15. An integrated circuit, comprising:

first and second gate structures, disposed on a semiconductor substrate, separately arranged along a first lateral direction, and respectively extending along a second lateral direction;

first and second source/drain structures, located between the first and second gate structures, and are laterally separated along the second lateral direction;

an isolation wall, extending along the first lateral direction in between the first and second source/drain structures, and having a first line section, a second line section laterally separated from the first line section and broad portions laterally expanding from and recessed with respect to the first and second line sections, wherein the first line section cuts the first gate structure into separate portions, the second line section cuts the second gate structure into separate portions, and the broad portions are connected with one another via the first and second line sections;

a lateral contact structure, extending in between the first and second gate structures, and connecting the first source/drain structure to the second source/drain structure across one of the broad portions of the isolation wall; and dielectric structures, respectively stacked on the broad portions of the isolation wall along a vertical direction perpendicular to the first lateral direction and the second lateral direction, wherein each of the broad portions is closer to the semiconductor substrate than the corresponding dielectric structure.

16. The integrated circuit according to claim 15, wherein one of the dielectric structures is disposed between the lateral contact structure and the corresponding broad portion of the isolation wall.

17. The integrated circuit according to claim 15, wherein a top surface of the lateral contact structure is substantially coplanar with top surfaces of the first and second gate structures.

18. The integrated circuit according to claim 15, wherein a top surface of the isolation wall is substantially coplanar with a top surface of the lateral contact structure.

19. The integrated circuit according to claim 15, wherein the lateral contact structure is vertically spaced apart from the one of the broad portions of the isolation wall.

20. The integrated circuit according to claim 15, wherein bottom surfaces of the broad portions of the isolation wall are substantially coplanar with bottom surfaces of the first and second line sections.

* * * * *